US011790854B2

(12) United States Patent
Song et al.

(10) Patent No.: US 11,790,854 B2
(45) Date of Patent: Oct. 17, 2023

(54) ELECTRONIC DEVICE AND METHOD OF DRIVING THE SAME

(71) Applicant: Samsung Display Co., Ltd., Yongin-Si (KR)

(72) Inventors: Heerim Song, Seoul (KR); Gyungsoon Park, Seoul (KR); Jinseok Jeong, Hwaseong-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/546,295

(22) Filed: Dec. 9, 2021

(65) Prior Publication Data

US 2022/0328008 A1    Oct. 13, 2022

(30) Foreign Application Priority Data

Apr. 12, 2021 (KR) .................. 10-2021-0047040

(51) Int. Cl.
*G09G 3/3266* (2016.01)
*G09G 3/00* (2006.01)
*G09G 3/3233* (2016.01)

(52) U.S. Cl.
CPC .......... *G09G 3/3266* (2013.01); *G09G 3/035* (2020.08); *G09G 3/3233* (2013.01);
(Continued)

(58) Field of Classification Search
CPC .... G09G 3/3266; G09G 3/035; G09G 3/3233; G09G 2310/0281; G09G 2310/0286;
(Continued)

(56) References Cited

U.S. PATENT DOCUMENTS 7,304,631 B2 * 12/2007 Morita ................. G09G 3/3688
345/100
7,414,599 B2    8/2008 Chung et al.
(Continued)

FOREIGN PATENT DOCUMENTS

KR         100560780 B1    3/2006
KR    1020160045215 A     4/2016
(Continued)

OTHER PUBLICATIONS

Extended European Search Report for Application No. 22166868.4-1210 dated Sep. 1, 2022 enumerating the above listed references in the Extended European Search Report.

*Primary Examiner* — Michael J Jansen, II
(74) *Attorney, Agent, or Firm* — CANTOR COLBURN LLP

(57) ABSTRACT

An electronic device includes a display panel including pixels respectively connected to scan lines, scan stages corresponding to the scan lines, where each of the scan stages receives a carry signal, and outputs a scan signal, masking circuits electrically connected to some of the scan stages, respectively, where each of the masking circuits outputs a masking carry signal in response to a masking signal and the scan signal, and transmission circuits electrically connected to others of the scan stages, respectively, where each of the transmission circuits outputs the scan signal output from a corresponding scan stage among the scan stages. A j-th (j is an integer greater than 1) scan stage among the scan stages receives one of the scan signal output from a (j−1)-th scan stage and the masking carry signal as the carry signal.

29 Claims, 18 Drawing Sheets

(52) U.S. Cl.
CPC .............. *G09G 2310/0281* (2013.01); *G09G 2310/0286* (2013.01); *G09G 2320/0209* (2013.01); *G09G 2320/0233* (2013.01); *G09G 2330/021* (2013.01)

(58) Field of Classification Search
CPC ... G09G 2320/0209; G09G 2320/0233; G09G 2330/021
See application file for complete search history.

(56) References Cited

U.S. PATENT DOCUMENTS

| | | | |
|---|---|---|---|
| 8,587,347 B2 | 11/2013 | Yoon et al. | |
| 8,698,724 B2* | 4/2014 | Kitayama | G09G 3/36 345/94 |
| 8,957,883 B2* | 2/2015 | Maruyama | G09G 3/3666 345/208 |
| 9,633,608 B2* | 4/2017 | Shin | G09G 3/20 |
| 9,886,891 B2* | 2/2018 | In | G09G 3/3266 |
| 9,972,265 B2 | 5/2018 | Na et al. | |
| 10,127,861 B2* | 11/2018 | Na | G09G 3/3266 |
| 10,198,998 B2* | 2/2019 | In | G09G 3/3225 |
| 10,395,616 B2* | 8/2019 | Koo | G09G 5/18 |
| 10,629,133 B2* | 4/2020 | Kim | H01L 27/1251 |
| 10,657,875 B2 | 5/2020 | Chung et al. | |
| 11,062,641 B2* | 7/2021 | Yamasaki | H04N 5/23293 |
| 11,158,265 B2* | 10/2021 | Seo | G09G 3/3266 |
| 11,367,400 B2* | 6/2022 | Kim | G09G 3/3266 |
| 11,373,600 B2* | 6/2022 | Lee | G09G 3/3233 |
| 11,393,404 B2* | 7/2022 | Seo | G09G 3/3266 |
| 11,410,610 B2* | 8/2022 | Seo | G09G 3/3233 |
| 11,410,612 B2* | 8/2022 | Jeong | G09G 3/3233 |
| 11,417,265 B2* | 8/2022 | Seo | G09G 5/14 |
| 11,423,843 B2* | 8/2022 | Kim | G09G 3/3266 |
| 11,450,251 B2* | 9/2022 | Seo | G09G 3/3233 |
| 11,488,521 B2* | 11/2022 | Choi | G09G 3/32 |
| 11,552,135 B2* | 1/2023 | In | H10K 59/131 |
| 11,600,231 B2* | 3/2023 | Kim | G09G 3/3233 |
| 2004/0070589 A1* | 4/2004 | Morita | G09G 3/3611 345/690 |
| 2007/0132703 A1* | 6/2007 | Sehata | G09G 3/3614 345/100 |
| 2008/0150860 A1 | 6/2008 | Hong | |
| 2011/0032231 A1* | 2/2011 | Maruyama | G09G 3/2096 345/208 |
| 2013/0155124 A1* | 6/2013 | Tsuge | G09G 5/10 345/690 |
| 2013/0235025 A1* | 9/2013 | Kitayama | G09G 3/3614 345/90 |
| 2014/0340431 A1* | 11/2014 | Yamakawa | G09G 3/3426 345/690 |
| 2015/0170607 A1* | 6/2015 | Shin | G09G 3/3406 345/690 |
| 2015/0358018 A1* | 12/2015 | Kim | G09G 3/20 345/208 |
| 2016/0217728 A1* | 7/2016 | In | G09G 3/2096 |
| 2016/0225311 A1 | 8/2016 | Hwang et al. | |
| 2016/0351160 A1* | 12/2016 | In | G09G 3/3225 |
| 2017/0186378 A1* | 6/2017 | Na | G09G 3/3266 |
| 2017/0287425 A1* | 10/2017 | Koo | G09G 3/3674 |
| 2018/0137805 A1 | 5/2018 | Zheng et al. | |
| 2020/0118509 A1 | 4/2020 | Noh et al. | |
| 2020/0143734 A1* | 5/2020 | Yamasaki | G09G 3/3677 |
| 2020/0303468 A1* | 9/2020 | In | H01L 27/3276 |
| 2021/0027700 A1 | 1/2021 | Chun et al. | |
| 2021/0035489 A1* | 2/2021 | Seo | G09G 3/3266 |
| 2021/0256912 A1* | 8/2021 | Seo | G09G 3/3266 |
| 2021/0350742 A1* | 11/2021 | Choi | G09G 3/32 |
| 2021/0407352 A1* | 12/2021 | Seo | G09G 3/3233 |
| 2021/0407427 A1* | 12/2021 | Lee | G09G 3/3233 |
| 2021/0407429 A1* | 12/2021 | Seo | G09G 3/3266 |
| 2021/0407430 A1* | 12/2021 | Seo | G09G 3/3266 |
| 2021/0407431 A1* | 12/2021 | Kim | G09G 3/3266 |
| 2022/0044638 A1* | 2/2022 | Kim | G09G 3/3266 |
| 2022/0139324 A1* | 5/2022 | Jeong | G09G 3/035 345/204 |
| 2022/0157250 A1* | 5/2022 | Kim | G11C 19/28 |

FOREIGN PATENT DOCUMENTS

| | | |
|---|---|---|
| KR | 1020160141132 A | 12/2016 |
| KR | 101963595 B1 | 4/2019 |
| KR | 1020190055466 A | 5/2019 |
| KR | 1020200041605 A | 4/2020 |

* cited by examiner

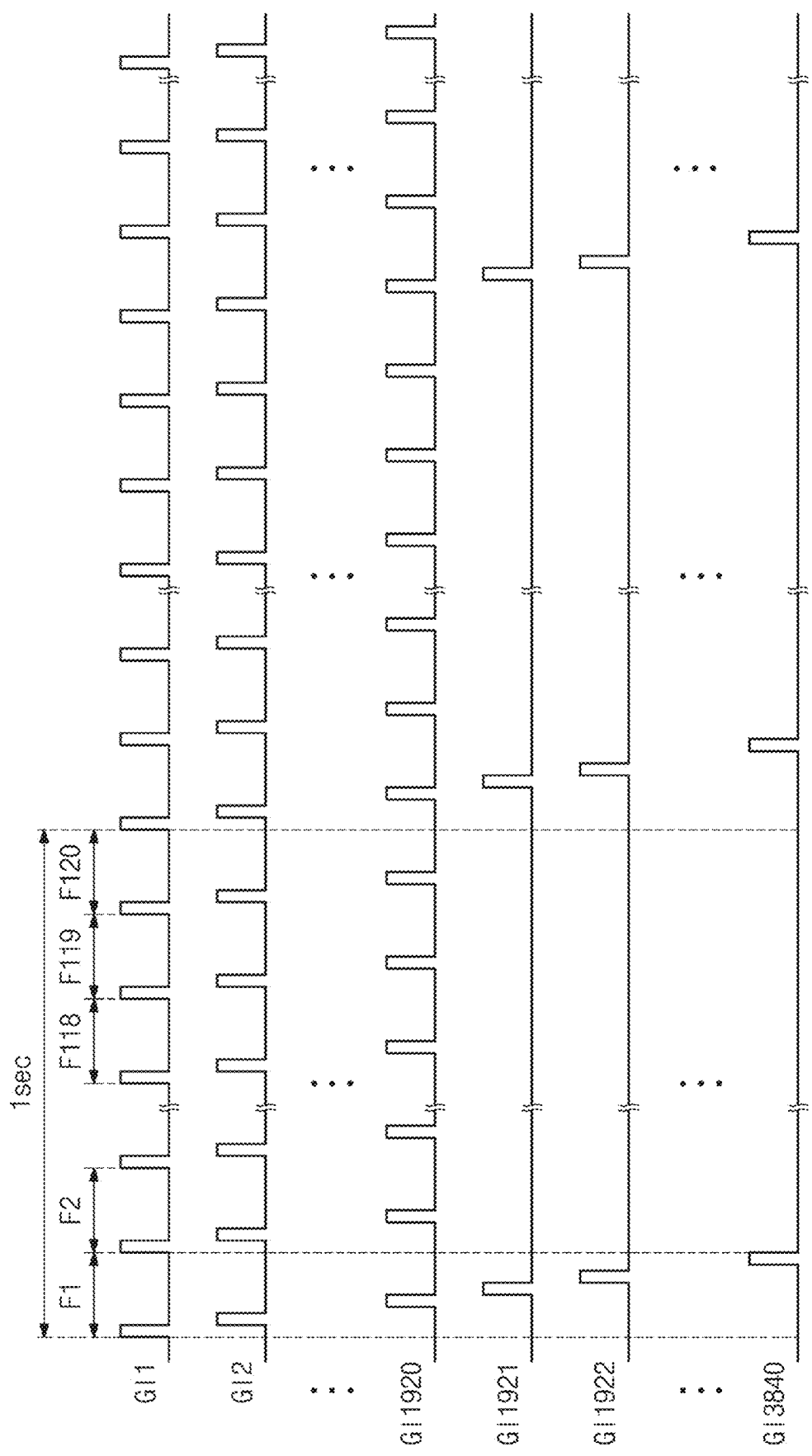

ELECTRONIC DEVICE AND METHOD OF DRIVING THE SAME

This application claims priority to Korean Patent Application No. 10-2021-0047040, filed on Apr. 12, 2021, and all the benefits accruing therefrom under 35 U.S.C. § 119, the content of which in its entirety is herein incorporated by reference.

BACKGROUND

1. Field

The disclosure relates to an electronic device in which a power consumption and a difference in brightness between pixels are reduced, and a method of driving the electronic device.

2. Description of the Related Art

Among display devices, an organic light emitting display device displays an image using an organic light emitting diode that generates a light from electron-hole recombination. The organic light emitting display device has desired characteristics, such as fast response speed and low power consumption.

The organic light emitting display device typically includes data lines, scan lines, and pixels connected to the data lines and the scan lines. Each pixel may include the organic light emitting diode and a circuit unit that controls an amount of current flowing through the organic light emitting diode. The circuit unit controls the amount of current flowing from a first driving voltage to a second driving voltage via the organic light emitting diode in response to a data signal. In this case, a light with a predetermined luminance corresponding to the amount of current flowing through the organic light emitting diode is generated.

SUMMARY

Recently, as the fields of use of the display device are diversified, a plurality of different images may be simultaneously displayed on a single display device. Accordingly, a technology for reducing power consumption of the display device when displaying the plural images is desired.

The disclosure provides an electronic device in which a power consumption and a difference in brightness between pixels are reduced.

The disclosure provides a method of driving the electronic device.

An embodiment of the invention provides an electronic device including a display panel including a plurality of data lines, a plurality of scan lines, and a plurality of pixels connected to the data lines and the scan lines, a plurality of scan stages corresponding to the scan lines, where each of the scan stages receives clock signals and a carry signal, and outputs a scan signal, a plurality of masking circuits electrically connected to some of the scan stages, respectively, where each of the masking circuits outputs a masking carry signal in response to a masking signal and the scan signal, and a plurality of transmission circuits electrically connected to others of the scan stages, respectively, where each of the transmission circuits outputs the scan signal output from a corresponding scan stage among the scan stages. In such an embodiment, a j-th scan stage among the scan stages receives one of the scan signal output from a (j−1)-th scan stage and the masking carry signal as the carry signal, where j is a positive integer number greater than 1).

In an embodiment, the masking signal may include a first masking signal and a second masking signal, each of the masking circuits outputs the scan signal output from the corresponding scan stage as the masking carry signal when the first masking signal has a first level and the second masking signal has a second level different from the first level, and each of the masking circuits may not output the scan signal output from the corresponding scan stage as the masking carry signal when the first masking signal has the second level and the second masking signal has the first level.

In an embodiment, each of the masking circuits may include a first masking transistor connected between a terminal of the corresponding scan stage, from which the scan signal of the corresponding scan stage among the scan stages is output, and a carry output terminal, where the first masking transistor may include a first gate electrode which receives the first masking signal and a second masking transistor connected between the carry output terminal and a first voltage terminal which receives a first voltage of the corresponding scan stage, where the second masking transistor may include a second gate electrode which receives the first masking signal.

In an embodiment, each of the transmission circuits may include a first transmission transistor connected between the terminal of the corresponding scan stage and the carry output terminal, where the first transmission transistor may include a third gate electrode which receives the first voltage and a second transmission transistor connected between the carry output terminal and the first voltage terminal, where the second transmission transistor may include a fourth gate electrode which receives a second voltage different from the first voltage.

In an embodiment, the electronic device may further include a driving controller which drives the display panel in a multi-frequency mode and a normal mode.

In an embodiment, the display panel may include a first display area and a second display area adjacent to the first display area, the first display area is driven at a first driving frequency in the multi-frequency mode, and the second display area is driven at a second driving frequency different from the first driving frequency in the multi-frequency mode.

In an embodiment, the first driving frequency may be higher than the second driving frequency.

In an embodiment, the driving controller may control the scan stages and the masking circuits.

In an embodiment, the driving controller may substantially simultaneously display a still image and a video through the first display area in the multi-frequency mode and changes the multi-frequency mode of the first display area to the normal mode when a time duration of the still image reaches a predetermined time.

In an embodiment, areas in which the masking circuits are respectively disposed may be the same as areas in which the transmission circuits are respectively disposed.

In an embodiment, the electronic device may further include a plurality of light emitting stages, the display panel may further include a plurality of light emitting control lines electrically connected to the pixels, respectively, and the light emitting stages may be electrically connected to the light emitting control lines, respectively, and receive the clock signals and the carry signal.

In an embodiment, the scan stages may include first scan stages, second scan stages, and third scan stages, areas in which the first scan stages, the second stages, and the light emitting stages are respectively disposed may have a same size as each other, and areas in which the third scan stages are respectively disposed may have a size smaller than areas in which the first scan stages are respectively disposed.

In an embodiment, the masking signal may have a width greater than a width of the scan signal.

In an embodiment, the scan signal may include a first portion having a first level and a second portion subsequent to the first portion and having a second level lower than the first level.

In an embodiment, the masking signal may overlap an entire portion of the scan signal output from one of the scan stages respectively connected to the masking circuits.

In an embodiment, a first scan signal output from an n-th scan stage among the scan stages respectively connected to the masking circuits may not overlap a second scan signal output from an (n−1)-th scan stage among the scan stages, where n is an integer greater than 1.

In an embodiment, the second scan signal may not overlap the masking signal.

In an embodiment, the first scan signal may overlap the masking signal.

In an embodiment, the masking signal may have a width greater than a width of each of the first and second scan signals.

An embodiment of the invention provides a method of driving an electronic device including a display panel and a plurality of scan stages, the method including allowing an i-th scan stage among the scan stages to receive clock signals and a carry signal and to output a first scan signal, allowing a masking circuit connected to the i-th scan stage to receive a masking signal and to output a masking carry signal based on the masking signal, where i is an integer greater than 0, and allowing an (i+1)-th scan stage among the scan stages to receive the masking carry signal as the carry signal and to output a second scan signal. In such an embodiment, the masking signal has a first width greater than a second width of the first scan signal, and the masking signal overlaps an entire portion of the first scan signal.

In an embodiment, the masking signal may include a first masking signal and a second masking signal, and the outputting the masking carry signal may include outputting the first scan signal as the masking carry signal when the first masking signal has a first level and the second masking signal has a second level different from the first level and allowing the first scan signal not to be output as the masking carry signal when the first masking signal has the second level and the second masking signal has the first level.

In an embodiment, the method further may include driving the display panel, where the display panel may include a first display area and a second display area adjacent to the first display area, and the driving the display panel may include driving the display panel in a multi-frequency mode or a normal mode, driving the first display area at a first driving frequency in the multi-frequency mode, and driving the second display area at a second driving frequency different from the first driving frequency in the multi-frequency mode.

In an embodiment, the first driving frequency may be higher than the second driving frequency.

In an embodiment, the driving the display panel in the multi-frequency mode or the normal mode may include substantially simultaneously displaying a still image and a video through the first display area in the multi-frequency mode and changing the multi-frequency mode of the first display area to the normal mode when a time duration of the still image reaches a predetermined time.

In an embodiment, the carry signal may include a first portion having a first level and a second portion subsequent to the first portion and having a second level lower than the first level.

In an embodiment, the masking circuit may be provided in plural, and a third scan signal output from an n-th scan stage among the scan stages respectively connected to the masking circuits may not overlap a fourth scan signal output from an (n−1)-th scan stage among the scan stages, where n is an integer greater than 1.

In an embodiment, the fourth scan signal may not overlap the masking signal.

In an embodiment, the third scan signal may overlap the masking signal.

In an embodiment, the masking signal may have a width greater than a width of each of the third scan signal and the fourth scan signal.

According to embodiments of the invention, the electronic device drives the first display area displaying the video at a normal frequency and drives the second display area displaying the still image at a low frequency lower than the normal frequency. As the driving frequency of the second display area is reduced, a power consumption of the electronic device decreases.

In such embodiments, the masking circuits are electrically connected to some of the scan stages, and the transmission circuits are electrically connected to others of the scan stages. In such embodiments, the areas where the scan stages are respectively disposed include a same number of transistors and have a same circuit density as each other. The areas have a same load, and each of the scan stages disposed in the areas has a same characteristics. Accordingly, a difference in brightness between rows in which the pixels are arranged is reduced. In such embodiments, a crosstalk phenomenon which may cause an image quality of the display panel to decrease due to different electrical interference between the pixels is reduced.

In such embodiments, the masking signal covers the scan signal output from the scan stage electrically connected to the masking circuit. The masking circuit stops (or masks) the outputting of the scan signal as the carry signal. The carry signal output from the transmission circuit is maintained at low level. Thus, the occurrence of difference in brightness between the pixel rows is effectively prevented.

BRIEF DESCRIPTION OF THE DRAWINGS

The above and other features of the disclosure will become readily apparent by reference to the following detailed description when considered in conjunction with the accompanying drawings, in which:

FIG. 15 is a waveform diagram showing scan signals in a multi-frequency mode according to an embodiment of the disclosure.

DETAILED DESCRIPTION

Figure 1:
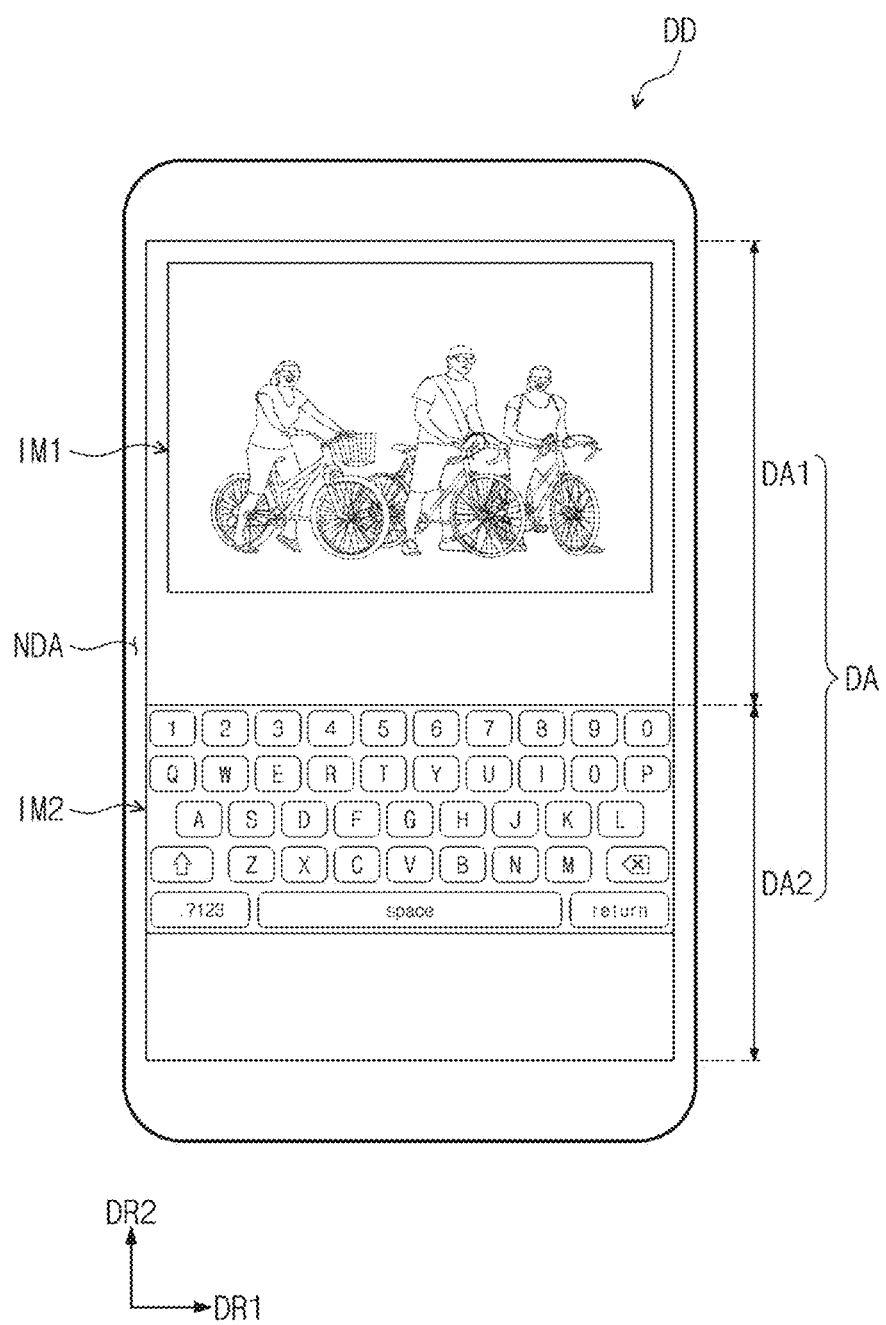
FIG. 1 is a plan view showing an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on" another element, there are no intervening elements present.

Like numerals refer to like elements throughout. In the drawings, the thickness of layers, films, and regions are exaggerated for clarity.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a plan view showing an electronic device according to an embodiment of the disclosure.

Referring to FIG. 1, an embodiment of the electronic device DD may be a portable device, for example. The portable device may include a tablet personal computer ("PC"), a smartphone, a personal digital assistant ("PDA"), a portable multimedia player ("PMP"), a game unit, a wrist-watch type electronic device, or the like, however, the disclosure is not limited thereto or thereby. Alternatively, the electronic device DD may be applied to a large-sized electronic device, such as a television set, an outdoor billboard, or the like, or a small- and medium-sized electronic device, such as a personal computer, a notebook computer, a kiosk, a car navigation unit, a camera, or the like. Alternatively, the electronic device DD may be employed in other electronic items without departing from the teachings herein.

In an embodiment, as shown in FIG. 1, a display surface on which a first image IM1 and a second image IM2 are displayed may be on a plane substantially parallel to a surface defined by a first direction DR1 and a second direction DR2. The electronic device DD may include a plurality of areas distinguished from each other on the display surface. The display surface may include a display area DA on which the first image IM1 and the second image IM2 are displayed and a non-display area NDA around the display area DA. The non-display area NDA may be referred to as a bezel area. In one embodiment, for example, the display area DA may have a quadrangular shape. The non-display area NDA may surround the display area DA. In an embodiment, although not shown in figures, the electronic device may have a curved shape in a portion thereof. In such an embodiment, the curved shape may be defined in a portion of the display area DA.

The display area DA of the electronic device DD may include a first display area DA1 and a second display area DA2. In a specific application program, the first image IM1 may be displayed in the first display area DA1, and the second image IM2 may be displayed in the second display area DA2. In one embodiment, for example, the first image IM1 may be a video, and the second image IM2 may be a still image or text information with a long cycle of change.

In an embodiment, the electronic device DD may drive the first display area DA1 in which the video is displayed at a normal frequency and may drive the second display area DA2 in which the still image is displayed at a low frequency lower than the normal frequency. In such an embodiment, the electronic device DD may decrease a driving frequency of the second display area DA2, and thus, a power consumption of the electronic device DD may decrease.

Each of the first display area DA1 and the second display area DA2 may have a predetermined size, and the size of the first display area DA1 and the second display area DA2 may vary according to an application program. According to an embodiment, when the still image is displayed in the first display area DA1 and the video is displayed in the second display area DA2, the first display area DA1 may be driven at the low frequency, and the second display area DA2 may be driven at the normal frequency. In an embodiment, the display area DA may be divided into three or more display areas, and the driving frequency of each of the display areas may be determined depending on the type of image (still image or video) displayed in each of the display areas.

Figure 2A:
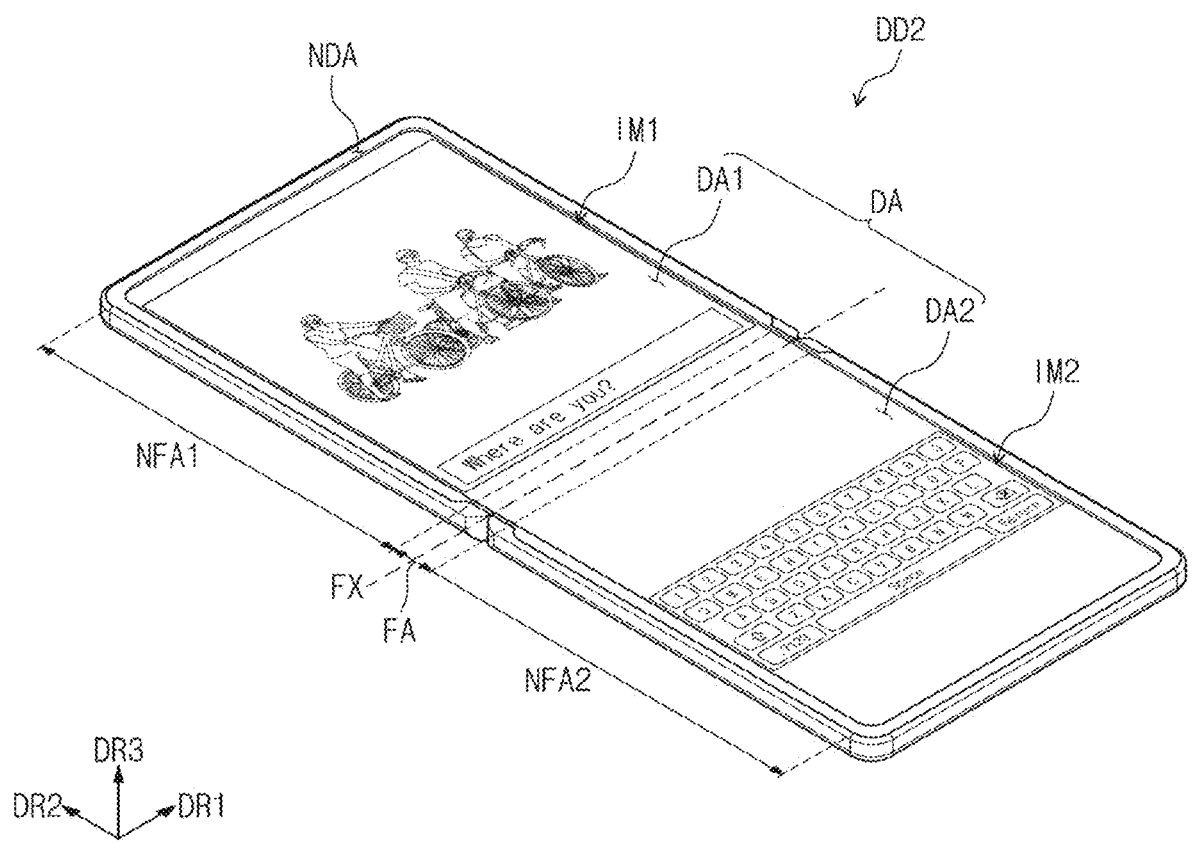
FIGS. 2A and 2B are perspective views showing an electronic device according to an embodiment of the disclosure.
Figure 2B:
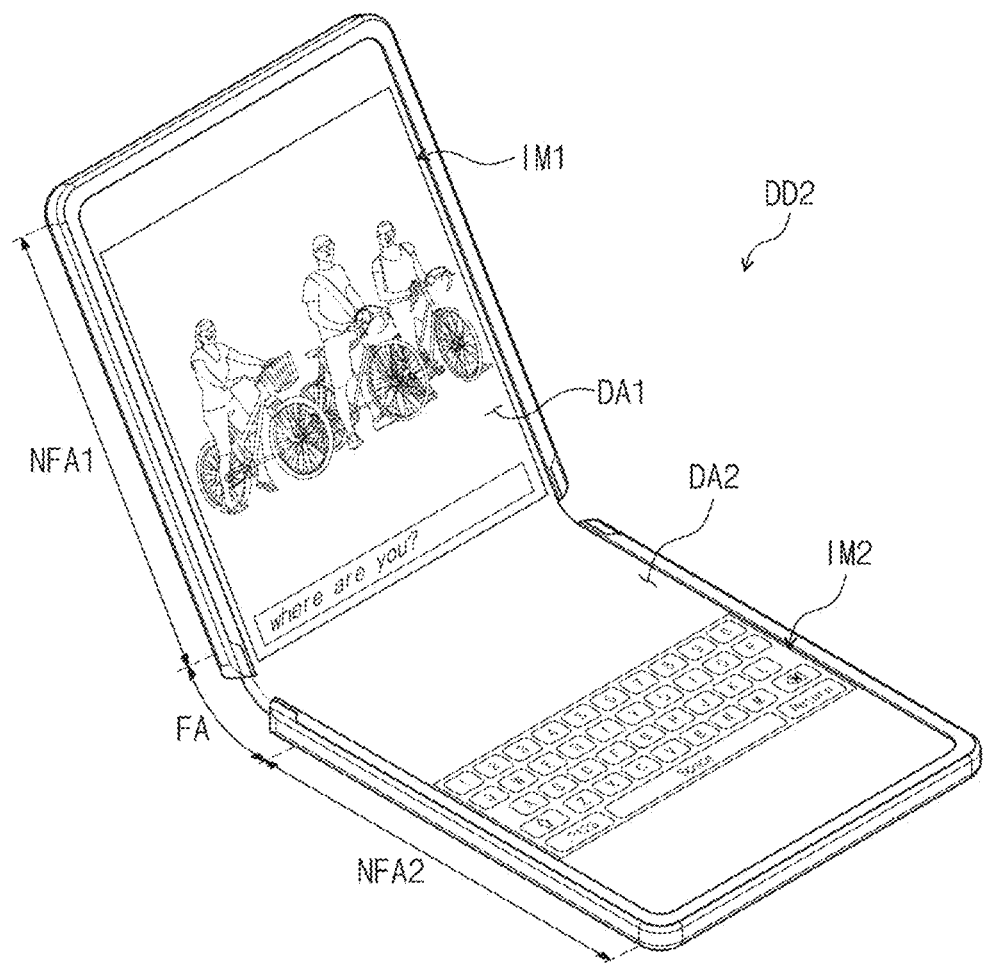

FIGS. 2A and 2B are perspective views showing an electronic device DD2 according to an embodiment of the disclosure. FIG. 2A shows the electronic device DD2 in an unfolded state, and FIG. 2B shows the electronic device DD2 in a folded state.

Referring to FIGS. 2A and 2B, an embodiment of the electronic device DD2 may include a display area DA and a non-display area NDA. The electronic device DD2 may display an image through the display area DA. When the electronic device DD2 is in the unfolded state, the display area DA may be on a plane defined by the first direction DR1 and the second direction DR2. A thickness direction of the electronic device DD2 may be substantially parallel to a third direction DR3 crossing the first direction DR1 and the second direction DR2. Accordingly, a front surface (or an upper surface) and a rear surface (or a lower surface) of each member of the electronic device DD2 may be defined with respect to the third direction DR3. The non-display area NDA may be referred to as a bezel area. In one embodiment, for example, the display area DA may have a quadrangular shape. The non-display area NDA may surround the display area DA.

The display area DA may include a first non-folding area NFA1, a folding area FA, and a second non-folding area NFA2. The folding area FA may be folded or foldable about a folding axis FX extending in the first direction DR1.

When the electronic device DD2 is folded, the first non-folding area NFA1 and the second non-folding area NFA2 may face each other. Accordingly, when the electronic device DD2 is completely folded, the display area DA may not be exposed to the outside, and such a folding operation of the electronic device DD2 may be referred to as an in-folding operation, but the operation of the electronic device DD2 should not be limited thereto or thereby.

In one embodiment, for example, when the electronic device DD2 is folded, the first non-folding area NFA1 and the second non-folding area NFA2 may face opposite directions to each other. Accordingly, when the electronic device DD2 is folded, the first non-folding area NFA1 may be exposed to the outside, and such a folding operation may be referred to as an out-folding operation.

In an embodiment, the electronic device DD2 may be operated in only one of the in-folding operation and the out-folding operation. According to an alternative embodiment, the electronic device DD2 may be operated in both the in-folding operation and the out-folding operation. In such an embodiment, the same area of the electronic device DD2, for example, the folding area FA may be inwardly folded (in-folding) and outwardly folded (out-folding). According to an embodiment, a portion of the electronic device DD2 may be inwardly folded (in-folding), and another portion of the electronic device DD2 may be outwardly folded (out-folding).

FIGS. 2A and 2B show an embodiment including a single folding area and two non-folding areas, for example, but the number of the folding areas and the number of the non-folding areas are not limited thereto or thereby. In one alternative embodiment, for example, the electronic device DD2 may include more than two non-folding areas and a plurality of folding areas disposed between the non-folding areas.

In an embodiment, as shown in FIGS. 2A and 2B, the folding axis FX is substantially parallel to a minor axis of the electronic device DD2, but the disclosure are not limited thereto or thereby. In one alternative embodiment, for example, the folding axis FX may extend in a direction substantially parallel to a major axis of the electronic device DD2, e.g., the second direction DR2. In such an embodiment, the first non-folding area NFA1, the folding area FA, and the second non-folding area NFA2 may be sequentially arranged in the first direction DR1.

A plurality of display areas DA1 and DA2 may be defined in the display area DA of the electronic device DD2. FIG. 2A shows an embodiment including two display areas DA1 and DA2, but the number of the display areas DA1 and DA2 is not limited thereto or thereby.

The display areas DA1 and DA2 may include a first display area DA1 and a second display area DA2. In one embodiment, for example, the first display area DA1 may be an area in which a first image IM1 is displayed, and the second display area DA2 may be an area in which a second image IM2 is displayed. In one embodiment, for example, the first image IM1 may be a video, and the second image IM2 may be a still image or text information with a long cycle of change.

Each of the first display area DA1 and the second display area DA2 may have a predetermined size, and the size of the first display area DA1 and the second display area DA2 may vary according to an application program. According to an embodiment, the first display area DA1 may correspond to the first non-folding area NFA1, and the second display area DA2 may correspond to the second non-folding area NFA2. In such an embodiment, a first portion of the folding area FA may correspond to the first display area DA1, and a second portion of the folding area FA may correspond to the second display area DA2.

According to an embodiment, the entire folding area FA may correspond to (be included in or defined by a portion of) either the first display area DA1 or the second display area DA2.

According to an embodiment, the first display area DA1 may correspond to a first portion of the first non-folding area NFA1, and the second display area DA2 may correspond to a second portion of the first non-folding area NFA1, the folding area FA, and the second non-folding area NFA2. In such an embodiment, the size of the first display area DA1 may be greater than the size of the second display area DA2.

According to an embodiment, the first display area DA1 may correspond to the first non-folding area NFA1, the folding area FA, and a first portion of the second non-folding area NFA2, and the second display area DA2 may correspond to a second portion of the second non-folding area NFA2. That is, the size of the second display area DA2 may be greater than the size of the first display area DA1.

In an embodiment, as shown in FIG. 2B, when the folding area FA is folded, the first display area DA1 may correspond to the first non-folding area NFA1, and the second display area DA2 may correspond to the folding area FA and the second non-folding area NFA2.

In an embodiment, as shown in FIGS. 2A and 2B, the electronic device DD2 may include a single folding area, for example, but the disclosure is not limited thereto or thereby. Alternatively, the disclosure may be applied to an electronic device including two or more folding areas, a rollable electronic device, or a slidable electronic device.

Hereinafter, for convenience of description, an embodiment of the electronic device DD shown in FIG. 1 will be described in detail, but the following descriptions may be applied to the electronic device DD2 shown in FIGS. 2A and 2B.

Figure 3A:
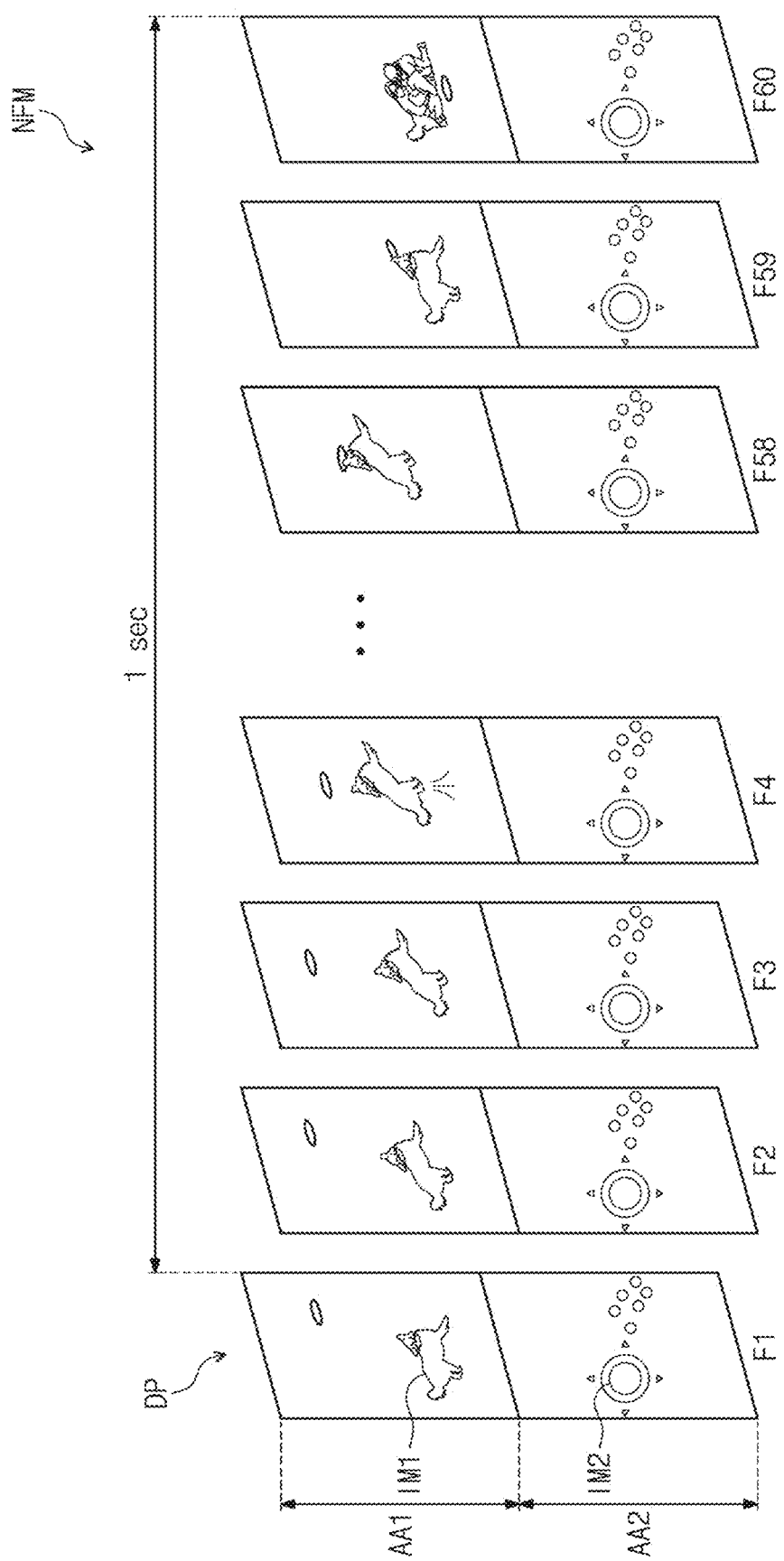
FIG. 3A is a view showing an operation of a display panel in a normal mode.
Figure 3B:
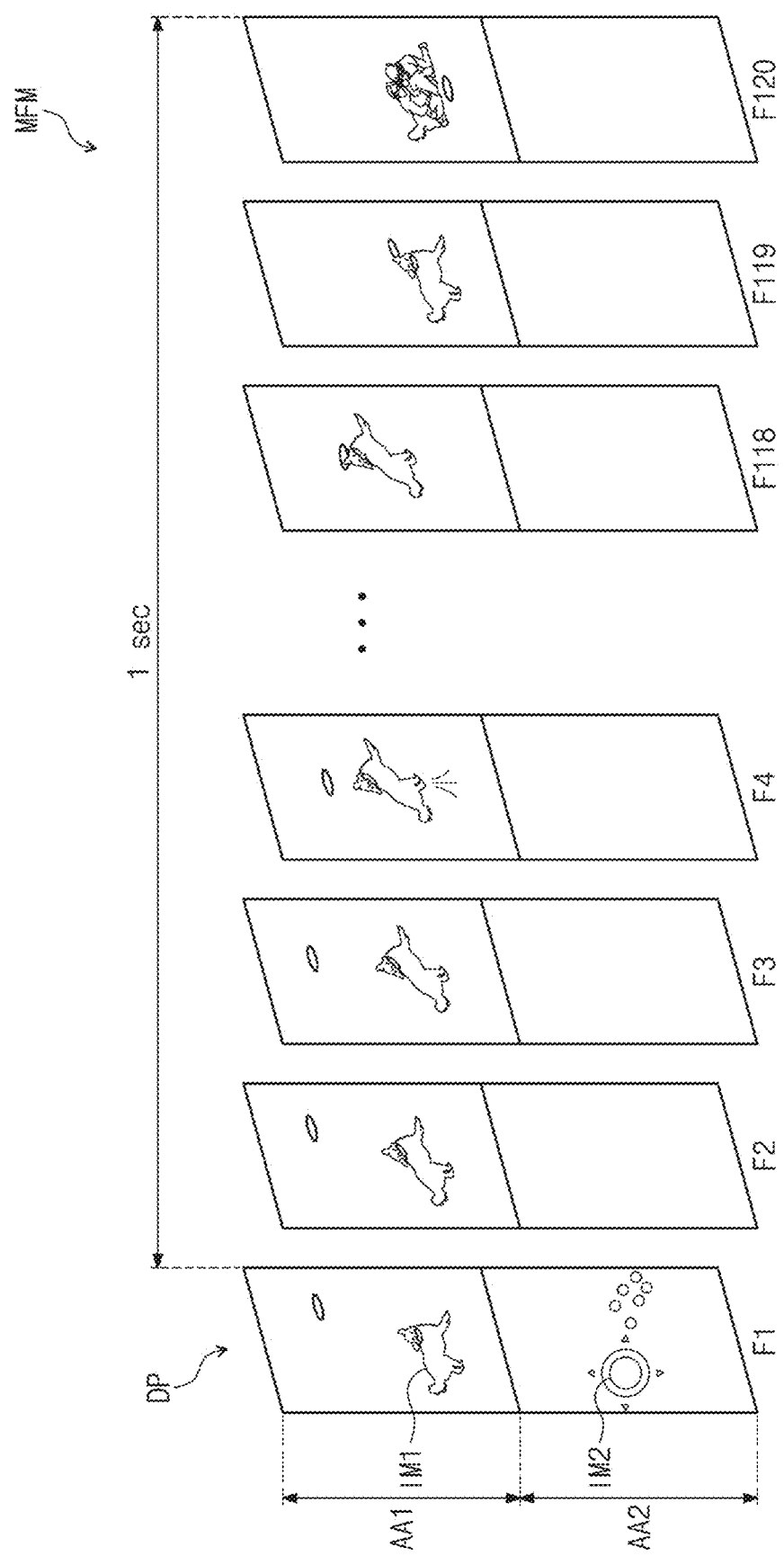
FIG. 3B is a view showing an operation of the display panel in a multi-frequency mode.

FIG. 3A is a view showing an operation of a display panel DP in a normal mode NFM, and FIG. 3B is a view showing an operation of the display panel DP in a multi-frequency mode MFM.

Referring to FIG. 3A, an embodiment of the electronic device DD (refer to FIG. 1) may include the display panel DP. According to an embodiment, the display panel DP may be a light emitting type display panel, but not being particularly limited. In one embodiment, for example, the display panel DP may be an organic light emitting display panel, a quantum dot display panel, a micro-light emitting diode ("LED") display panel, or a nano-LED display panel. A light emitting layer of the organic light emitting display panel may include an organic light emitting material. A light emitting layer of the quantum dot display panel may include a quantum dot and a quantum rod. A light emitting layer of the micro-LED display panel may include a micro-LED. A light emitting layer of the nano-LED display panel may include a nano-LED. Hereinafter, for convenience of description, embodiments where the display panel DP is the organic light emitting display panel will be described in detail.

The display panel DP may include a first display area AA1 and a second display area AA2. When viewed in a plane, the first display area AA1 may correspond to the first display area DA1 (refer to FIG. 1) of the electronic device DD (refer to FIG. 1), and the second display area AA2 may correspond to the second display area DA2 (refer to FIG. 1) of the electronic device DD (refer to FIG. 1).

The display panel DP may be operated differently depending on an operation mode. The operation mode may include the normal mode NFM and the multi-frequency mode MFM. In the normal mode NFM, the display panel DP may drive both the first display area AA1 and the second display area AA2 at the normal frequency. In the multi-frequency mode MFM, the display panel DP may drive the first display area AA1 in which the first image IM1 is displayed at a first driving frequency and may drive the second display area AA2 in which the second image IM2 is displayed at a second driving frequency lower than the normal frequency. According to an embodiment, the first driving frequency may be the same as the normal frequency.

Referring to FIG. 3A, the first image IM1 displayed in the first display area AA1 may be the video, and the second image IM2 displayed in the second display area AA2 may be the still image or the image with the long cycle of change, e.g., a keypad for the control of a game.

In the normal mode NFM, the driving frequency of the first display area AA1 and the second display area AA2 of the display panel DP may be the normal frequency. In one embodiment, for example, the normal frequency may be about 60 hertz (H)z. In the normal mode NFM, images of a first frame F1 to a sixtieth frame F60 may be displayed for 1 second in the first display area AA1 and the second display area AA2 of the display panel DP, for example, but the normal frequency may be variously modified. In one alternative embodiment, for example, the normal frequency may be about 120 Hz.

Referring to FIG. 3B, during the multi-frequency mode MFM, the display panel DP may set the driving frequency of the first display area AA1 in which the first image IM1, i.e., the video, is displayed to the first driving frequency and may set the driving frequency of the second display area AA2 in which the second image IM2, i.e., the still image, is displayed to the second driving frequency lower than the first driving frequency. When the normal frequency is about 60 Hz, the first driving frequency may be about 120 Hz, and the second driving frequency may be about 1 Hz. The first driving frequency and the second driving frequency may be changed in various ways. In one embodiment, for example, the first driving frequency may be about 144 Hz that is higher than the normal frequency or may be about 60 Hz that is the same as the normal frequency. In one embodiment, for example, the second driving frequency may be about 30 Hz, about 10 Hz, or about 1 Hz that is lower than the normal frequency.

In the multi-frequency mode MFM, when the first driving frequency is about 120 Hz and the second driving frequency is about 1 Hz, the first image IM1 of the first frame F1 to a 120th frame F120 may be displayed for 1 second through the first display area AA1. The second image IM2 may be displayed in the second display area AA2 only in the first frame F1, and images may not be displayed in the other frames F2 to F120.

Figure 4:
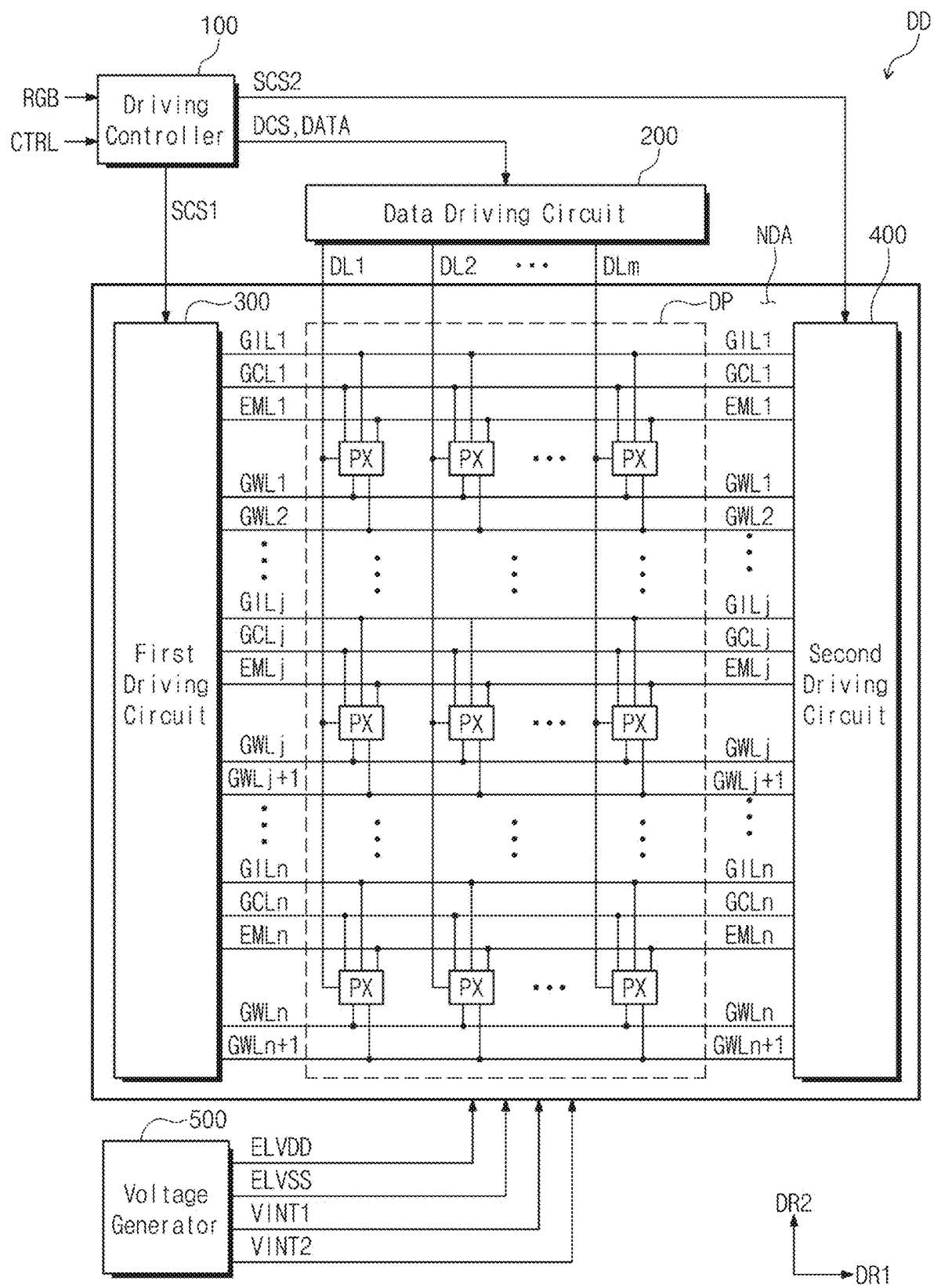
FIG. 4 is a block diagram showing an electronic device according to an embodiment of the disclosure.

FIG. 4 is a block diagram showing the electronic device DD according to an embodiment of the disclosure.

Referring to FIG. 4, an embodiment of the electronic device DD may include the display panel DP, a driving controller 100, a data driving circuit 200, a first driving circuit 300, a second driving circuit 400, and a voltage generator 500.

The driving controller 100 may receive an input signal including image signals RGB and control signals CTRL. The driving controller 100 may convert a data format of the image signals RGB to a data format appropriate to an interface between the data driving circuit 200 and the driving controller 100 to generate image data signals DATA. The driving controller 100 may control the data driving circuit 200, the first driving circuit 300, and the second driving circuit 400 such that the image is displayed on the display panel DP. The driving controller 100 may output a first scan control signal SCS1, a second scan control signal SCS2, and a data control signal DCS based on the control signal CTRL.

The data driving circuit 200 may receive the data control signal DCS and the image data signals DATA from the driving controller 100. The data driving circuit 200 may convert the image data signals DATA to data signals and may output the data signals to a plurality of data lines DL1 to DLm which will be described later. The data signals may be analog voltages corresponding to grayscale values of the image data signals DATA.

The voltage generator 500 may generate voltages used to operate the display panel DP. The voltage generator 500 may generate a first driving voltage ELVDD, a second driving voltage ELVSS, a first initialization voltage VINT1, and a second initialization voltage VINT2.

The display panel DP may include scan lines GIL1 to GILn, GCL1 to GCLn, and GWL1 to GWLn+1, light emitting control lines EML1 to EMLn, the data lines DL1 to DLm, and pixels PX. The first driving circuit 300 may be disposed at a first side of the display panel DP, and the second driving circuit 400 may be disposed at a second side of the display panel DP. The scan lines GIL1 to GILn, GCL1 to GCLn, and GWL1 to GWLn+1 and the light emitting control lines EML1 to EMLn may be electrically connected to the first driving circuit 300 and the second driving circuit 400.

The scan lines GIL1 to GILn, GCL1 to GCLn, and GWL1 to GWLn+1 and the light emitting control lines EML1 to EMLn may be arranged in the second direction DR2 and may be spaced apart from each other. The data lines DL1 to DLm may extend in a direction opposite to the second direction DR2 from the data driving circuit 200 and may be arranged in the first direction DR1 to be spaced apart from each other.

In an embodiment of the electronic device DD, as shown in FIG. 4, the first driving circuit 300 and the second driving circuit 400 may be disposed to face each other with the pixels PX interposed therebetween, but the disclosure is not limited thereto or thereby. According to an alternative embodiment, the electronic device DD may include only one of the first driving circuit 300 and the second driving circuit 400.

The pixels PX may be electrically connected to the scan lines GIL1 to GILn, GCL1 to GCLn, and GWL1 to GWLn+1, the light emitting control lines EML1 to EMLn, and the data lines DL1 to DLm, respectively. Each of the pixels PX may be electrically connected to four scan lines and one light emitting control line. In one embodiment, for example, as shown in FIG. 4, the pixels arranged in a first row may be connected to the scan lines GIL1, GCL1, GWL1, and GWL2 and the light emitting control line EML1. In an embodiment, the pixels arranged in a j-th row may be connected to scan lines GILj, GCLj, GWLj, and GWLj+1 and light emitting control line EMLj.

Each of the pixels PX may receive the first driving voltage ELVDD, the second driving voltage ELVSS, the first initialization voltage VINT1, and the second initialization voltage VINT2.

The first driving circuit 300 may receive the first scan control signal SCS1 from the driving controller 100. The first driving circuit 300 may output scan signals to the scan lines GIL1 to GILn, GCL1 to GCLn, and GWL1 to GWLn+1 and may output light emitting signals to the light emitting control lines EML1 to EMLn in response to the first scan control signal SCS1.

The second driving circuit 400 may receive the second scan control signal SCS2 from the driving controller 100. The second driving circuit 400 may output the scan signals to the scan lines GIL1 to GILn, GCL1 to GCLn, and GWL1 to GWLn+1 and may output the light emitting signals to the light emitting control lines EML1 to EMLn in response to the second scan control signal SCS2.

The driving controller 100 may divide the display panel DP into the first display area AA1 (refer to FIG. 3A) and the second display area AA2 (refer to FIG. 3A) and may set the driving frequency of each of the first display area AA1 (refer to FIG. 3A) and the second display area AA2 (refer to FIG. 3A) based on the input signal including the image signals RGB and the control signals CTRL. In one embodiment, for example, in the normal mode NFM (refer to FIG. 3A), the driving controller 100 may drive each of the first display area AA1 (refer to FIG. 3A) and the second display area AA2 (refer to FIG. 3A) at the normal frequency, e.g., about 60 Hz. In the multi-frequency mode MFM (refer to FIG. 3B), the driving controller 100 may output the first scan control signal SCS1, the second scan control signal SCS2, and the data control signal DCS to drive the first display area AA1 (refer to FIG. 3B) at the first driving frequency, e.g., about 120 Hz, and to drive the second display area AA2 (refer to FIG. 3B) at the second driving frequency, e.g., about 1 Hz.

In the multi-frequency mode MFM (refer to FIG. 3B), the driving controller 100 may substantially simultaneously display the still image and the video in the first display area AA1 (refer to FIG. 3B). The driving controller 100 may change a mode of the first display area AA1 (refer to FIG. 3B) to the normal mode NFM (refer to FIG. 3A) when a duration of the still image reaches a predetermined time.

Figure 5:
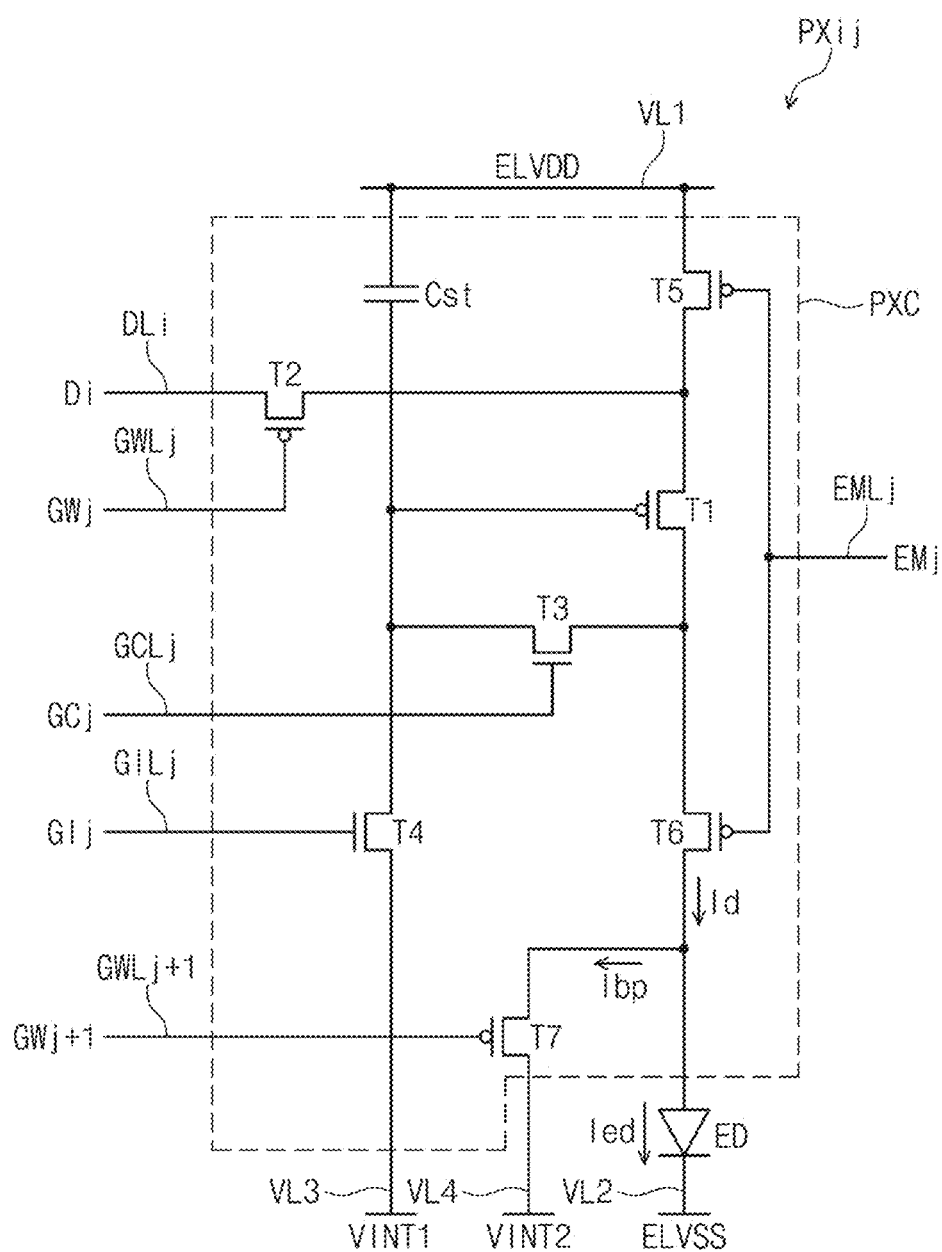
FIG. 5 is an equivalent circuit diagram showing a pixel according to an embodiment of the disclosure.

FIG. 5 is an equivalent circuit diagram showing a pixel PXij according to an embodiment of the disclosure.

FIG. 5 shows an equivalent circuit diagram of an embodiment of the pixel PXij connected to an i-th data line DLi among the data lines DL1 to DLm, j-th scan lines GILj, GCLj, and GWLj and a (j+1)th scan line GWLj+1 among the scan lines GIL1 to GILn, GCL1 to GCLn, and GWL1 to GWLn+1 and a j-th light emitting control line EMLj among the light emitting control lines EML1 to EMLn shown in FIG. 4.

Each of the pixels PX shown in FIG. 4 may have substantially the same configuration as that of the equivalent circuit diagram of the pixel PXij shown in FIG. 5.

Each of the pixels PX may include a light emitting diode ED and a pixel circuit PXC that controls a light emission of the light emitting diode ED. The pixel circuit PXC may include one or more transistors and one or more capacitors. The first driving circuit 300 and the second driving circuit 400 may include transistors formed through the same process as the pixel circuit PXC.

The pixel circuit PXC of the pixel PXij may include first, second, third, fourth, fifth, sixth, and seventh transistors T1, T2, T3, T4, T5, T6, and T7. Among the first to seventh transistors T1 to T7, each of the third and fourth transistors T3 and T4 is an N-type transistor including an oxide semiconductor as its semiconductor layer, and each of the first, second, fifth, sixth, and seventh transistors T1, T2, T5, T6, and T7 is a P-type transistor including a low-temperature polycrystalline silicon ("LTPS") as a semiconductor layer thereof. However, the disclosure is not limited thereto or thereby, and alternatively, all the first to seventh transistors T1 to T7 may be the P-type transistor or the N-type transistor. According to an embodiment, at least one of the first to seventh transistors T1 to T7 may be the N-type transistor, and another of the first to seventh transistors T1 to T7 may be the P-type transistor. In an embodiment, the circuit configuration of the pixel is not limited to that shown in FIG. 5. FIG. 5 shows merely one embodiment of the pixel circuit PXC, and the configuration of the pixel circuit PXC may be variously modified.

Referring to FIG. 5, an embodiment of the pixel PXij of the electronic device may include the first to seventh transistors T1, T2, T3, T4, T5, T6, and T7, a capacitor Cst, and at least one light emitting diode ED. Hereinafter, an embodiment having a structure in which one pixel PXij includes a single light emitting diode ED will be described.

The scan lines GILj, GCLj, GWLj, and GWLj+1 may transmit scan signals GIj, GCj, GWj, and GWj+1, respectively, and the light emitting control line EMLj may transmit a light emitting signal EMj. The data line DLi may transmit a data signal Di. The data signal Di may have a voltage level corresponding to the image signal RGB input to the electronic device DD (refer to FIG. 4). In such an embodiment, first, second, third, and fourth driving voltage lines VL1, VL2, VL3, and VL4 may transmit the first driving voltage ELVDD, the second driving voltage ELVSS, the first initialization voltage VINT1, and the second initialization voltage VINT2, respectively.

The first transistor T1 may include a first electrode connected to the first driving voltage line VL1 via the fifth transistor T5, a second electrode electrically connected to an anode of the light emitting diode ED via the sixth transistor T6, and a gate electrode connected to one end of the capacitor Cst. The first transistor T1 may receive the data signal Di transmitted by the data line DLi based on a switching operation of the second transistor T2 and may supply a driving current Id to the light emitting diode ED.

The second transistor T2 may include a first electrode connected to the data line DLi, a second electrode connected to the first electrode of the first transistor T1, and a gate electrode connected to the scan line GWLj. The second transistor T2 may be turned on in response to the scan signal GWj applied thereto via the scan line GWLj and may transmit the data signal Di applied thereto via the data line DLi to the first electrode of the first transistor T1.

The third transistor T3 may include a first electrode connected to the gate electrode of the first transistor T1, a second electrode connected to the second electrode of the first transistor T1, and a gate electrode connected to the scan line GCLj. The third transistor T3 may be turned on in response to the scan signal GCj applied thereto via the scan line GCLj and may connect the gate electrode and the second electrode of the first transistor T1 to each other to allow the first transistor T1 to be connected in a diode configuration.

The fourth transistor T4 may include a first electrode connected to the gate electrode of the first transistor T1, a second electrode connected to the third driving voltage line VL3 to which the first initialization voltage VINT1 is transmitted, and a gate electrode connected to the scan line GILj. The fourth transistor T4 may be turned on in response to the scan signal GIj applied thereto via the scan line GILj and may transmit the first initialization voltage VINT1 to the gate electrode of the first transistor T1 to perform an initialization operation that initializes a voltage of the gate electrode of the first transistor T1.

The fifth transistor T5 may include a first electrode connected to the first driving voltage line VL1, a second electrode connected to the first electrode of the first transistor T1, and a gate electrode connected to the light emitting control line EMLj.

The sixth transistor T6 may include a first electrode connected to the second electrode of the first transistor T1, a second electrode connected to the anode of the light emitting diode ED, and a gate electrode connected to the light emitting control line EMLj.

The fifth transistor T5 and the sixth transistor T6 may be substantially simultaneously turned on in response to the light emitting signal EMj applied thereto via the light emitting control line EMLj, and thus, the first driving voltage ELVDD may be compensated for by the first transistor T1 connected in the diode configuration and may be transmitted to the light emitting diode ED.

The seventh transistor T7 may include a first electrode connected to the second electrode of the sixth transistor T6, a second electrode connected to the fourth driving voltage line VL4, and a gate electrode connected to the scan line GWLj+1. The seventh transistor T7 may be turned on in response to the scan signal GWj+1 applied thereto via the scan line GWLj+1 and may bypass a current of the anode of the light emitting diode ED to the fourth driving voltage line VL4.

In an embodiment, as described above, the one end of the capacitor Cst may be connected to the gate electrode of the first transistor T1, and the other end of the capacitor Cst may be connected to the first driving voltage line VL1. A cathode of the light emitting diode ED may be connected to the second driving voltage line VL2 that transmits the second driving voltage ELVSS. The structure of the pixel PXij is not limited to the structure shown in FIG. 5, and the number of the transistors and the number of the capacitors, which are included in one pixel PXij, and the connection relation thereof may be modified in various ways.

Figure 6:
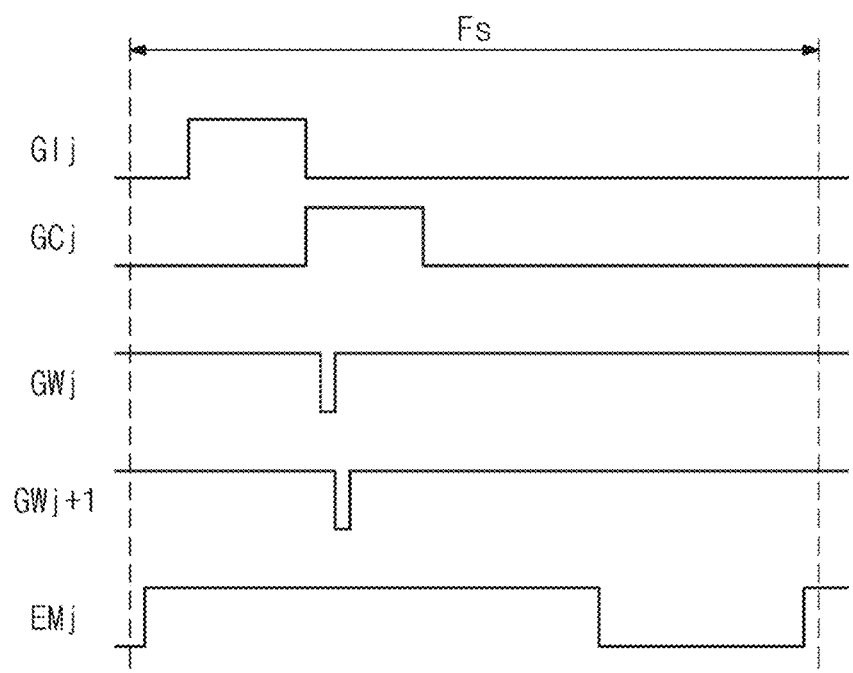
FIG. 6 is a signal timing diagram showing an operation of the pixel shown in FIG. 5.

FIG. 6 is a signal timing diagram showing an operation of the pixel shown in FIG. 5.

Referring to FIGS. 5 and 6, in an embodiment, the scan signal GIj having a high level is provided via the scan line GILj during an initialization period within one frame Fs. When the fourth transistor T4 is turned on in response to the scan signal GIj having the high level, the first initialization voltage VINT1 is applied to the gate electrode of the first transistor T1 via the fourth transistor T4, and thus, the first transistor T1 is initialized.

Then, when the scan signal GCj having the high level is provided through the scan line GLj during a data programming and compensation period, the third transistor T3 is turned on. The first transistor T1 is connected in a diode configuration by the turned-on third transistor T3 and is forward-biased. During the data programming and compensation period, the second transistor T2 is turned on in response to the scan signal GIj having a low level. Then, a compensation voltage (Di-Vth) obtained by subtracting a threshold voltage (Vth) of the first transistor T1 from the data signal Di provided via the data line DLi is applied to the gate electrode of the first transistor T1. That is, a gate voltage applied to the gate electrode of the first transistor T1 may be the compensation voltage (Di-Vth).

The first driving voltage ELVDD and the compensation voltage (Di-Vth) are respectively applied to both ends of the capacitor Cst, and the capacitor Cst may be charged with electric charges corresponding to a difference in voltage between the both ends of the capacitor Cst.

During the data programming and compensation period, the seventh transistor T7 is turned on in response to the scan signal GWj+1 having the low level applied thereto via the scan line GWLj+1. A portion of the driving current Id is bypassed to the fourth driving voltage line VL4 as a bypass current Ibp via the seventh transistor T7.

If the light emitting diode ED emits a light even when a minimum current of the first transistor T1 for displaying a black image flows as a driving current, the black image may not be properly displayed. In an embodiment, as described above, the seventh transistor T7 of the pixel PXij may distribute a portion of the minimum current of the first transistor T1 to another current path as the bypass current Ibp rather than to a current path to the light emitting diode. In such an embodiment, the minimum current of the first transistor T1 means a current under a condition that a gate-source voltage (Vgs) of the first transistor T1 is less than the threshold voltage (Vth) and the first transistor T1 is turned off. In such an embodiment, as described above, when the minimum driving current that turns off the first transistor T1, for example, a current of less than about 10 picoamperes (pA), is transmitted to the light emitting diode ED, an image with a black luminance is displayed. In the case where the minimum driving current for displaying the black image flows, an influence of bypass transmission of the bypass current Ibp is large, however, in the case where a large driving current for displaying images such as a general image or a white image flows, the influence of the bypass current Ibp is negligible. Accordingly, when the driving current for displaying the black image flows, a light emitting current Ied of the light emitting diode ED reduced by an amount of the bypass current Ibp, which is bypassed through the seventh transistor T7, from the driving current Id has a minimum current amount at a level that may clearly display the black image. Thus, a contrast ratio may be improved by realizing an accurate black luminance image using the seventh transistor T7. In an embodiment, the bypass signal may correspond to the scan signal GWj+1 having the low level, but not being limited thereto or thereby.

Then, as shown in FIG. 6, a level of the light emitting signal EMj provided from the light emitting control line EMLj is changed to a low level from a high level during a light emitting period. The fifth transistor T5 and the sixth transistor T6 are turned on in response to the light emitting signal EMj having the low level during the light emitting period. As a result, the driving current Id is generated due to a difference in voltage between the gate voltage of the gate electrode of the first transistor T1 and the first driving voltage ELVDD, the driving current Id is supplied to the light emitting diode ED via the sixth transistor T6, and thus, the light emitting current Ied flows through the light emitting diode ED.

Figure 7:
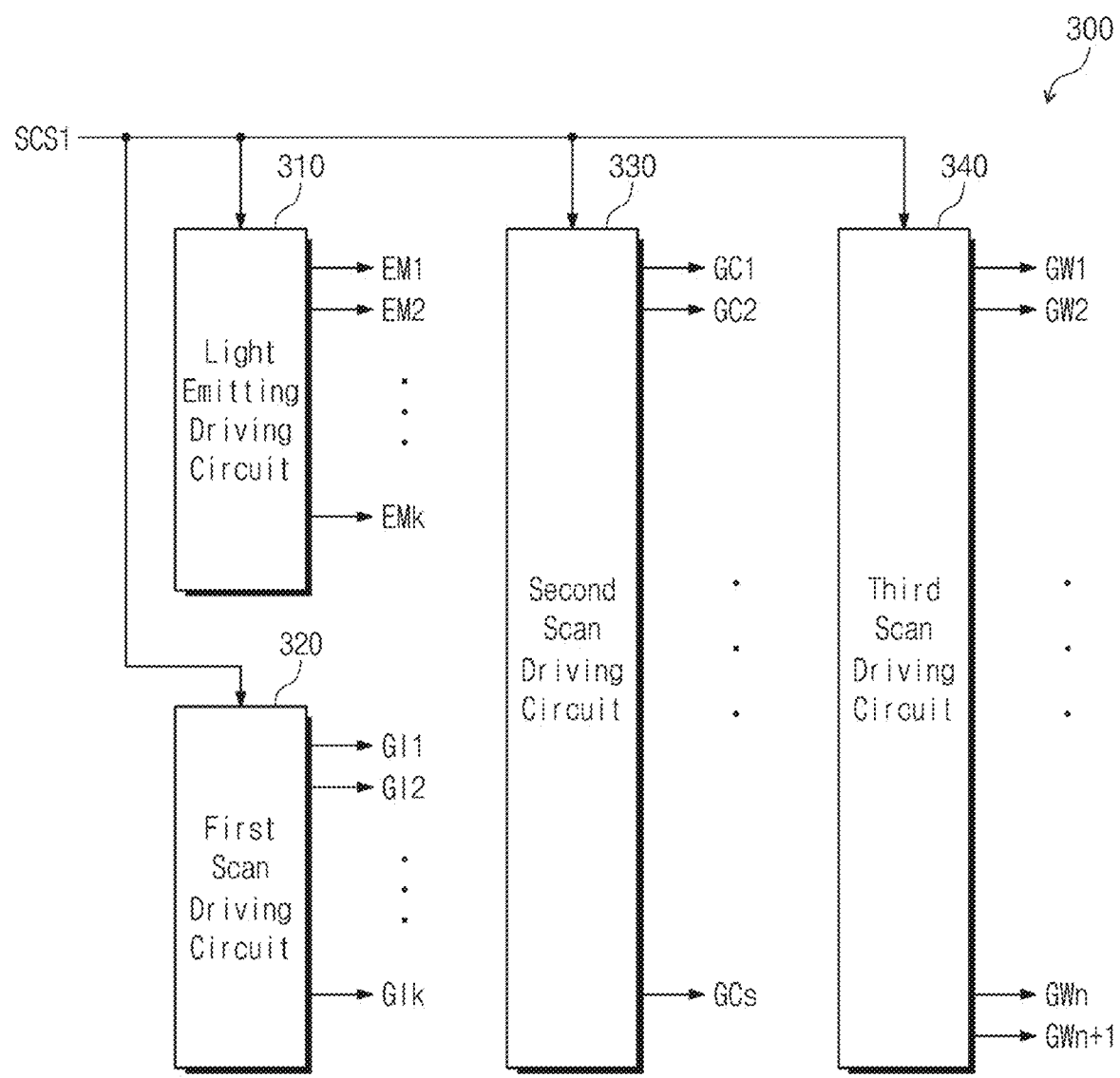
FIG. 7 is a block diagram showing an embodiment of a first driving circuit shown in FIG. 4.

FIG. 7 is a block diagram showing an embodiment of the first driving circuit 300 shown in FIG. 4.

Referring to FIGS. 4 and 7, an embodiment of the first driving circuit 300 may include a light emitting driving circuit 310, a first scan driving circuit 320, a second scan driving circuit 330, and a third scan driving circuit 340.

The light emitting driving circuit 310 may output light emitting control signals EM1 to EMk, which are to be applied to the light emitting control lines EML1 to EMLn shown in FIG. 4, in response to the first scan control signal SCS1. In an embodiment, each of n and k is a natural number, and n may be greater than k (i.e., n>k). That is, each of the light emitting control signals EM1 to EMk may be applied to two or more corresponding light emitting control lines among the light emitting control lines EML1 to EMLn.

The first scan driving circuit 320 may output the scan signals GI1 to GIk, which are to be applied to the scan lines GIL1 to GILn, in response to the first scan control signal SCS1. In an embodiment, n may be greater than k (i.e., n>k). That is, each of the scan signals GI1 to GIk may be applied to two or more corresponding scan lines among the scan lines GIL1 to GILn.

The second scan driving circuit 330 may output the scan signals GC1 to GCs, which are to be applied to the scan lines GCL1 to GCLn, in response to the first scan control signal SCS1. In an embodiment, s is a natural number, and n may be greater than s (i.e., n>s). That is, each of the scan signals GC1 to GCs may be applied to two or more corresponding scan lines among the scan lines GCL1 to GCLn.

The third scan driving circuit 340 may output the scan signals GW1 to GWn, which are to be applied to the scan lines GWL1 to GWLn, in response to the first scan control signal SCS1.

Figure 8:
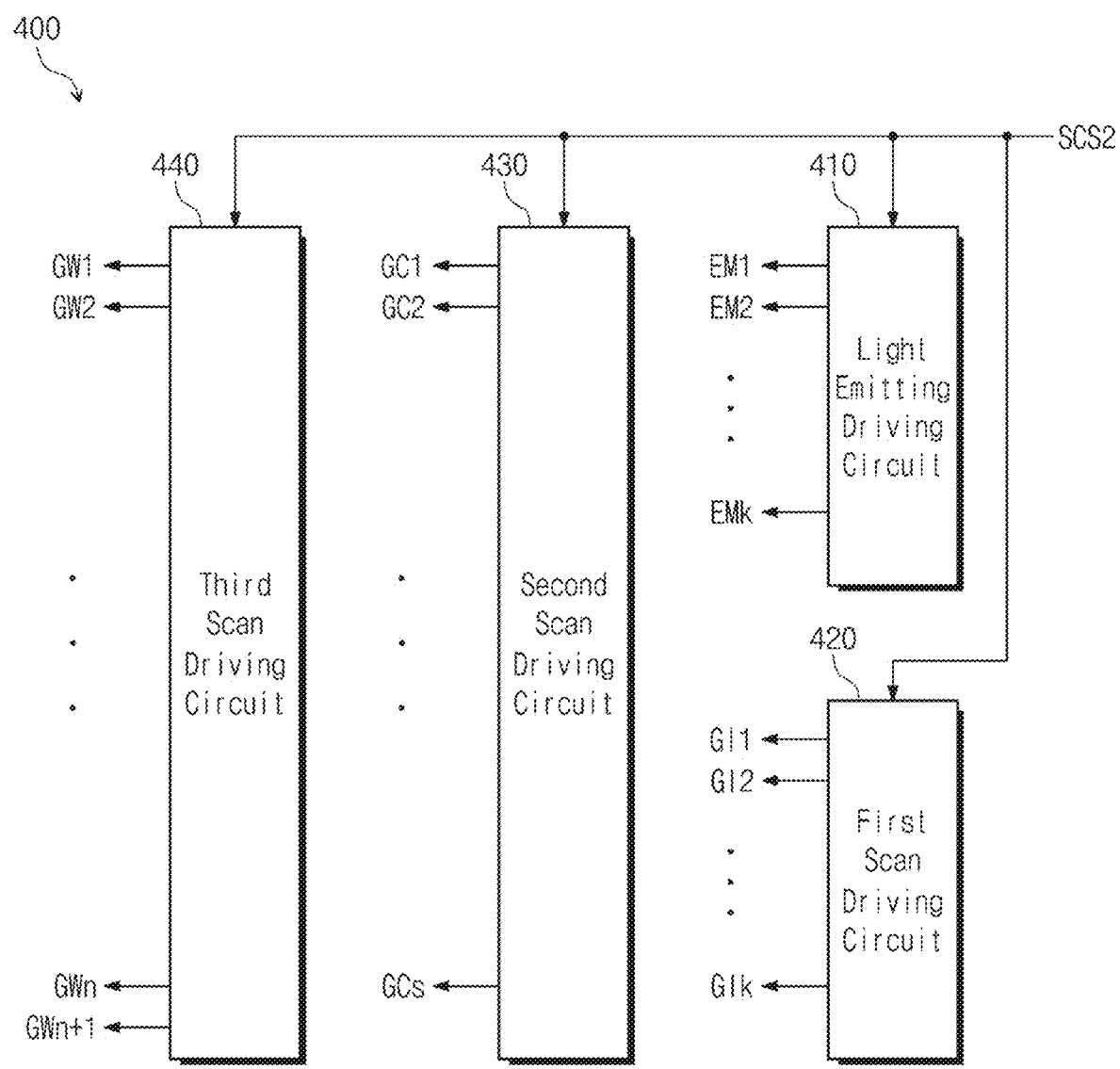
FIG. 8 is a block diagram showing an embodiment of a second driving circuit shown in FIG. 4.

FIG. 8 is a block diagram showing an embodiment of the second driving circuit 400 shown in FIG. 4.

Referring to FIG. 8, an embodiment of the second driving circuit 400 may include a light emitting driving circuit 410, a first scan driving circuit 420, a second scan driving circuit 430, and a third scan driving circuit 440.

The light emitting driving circuit 410 may output the light emitting control signals EM1 to EMk, which are to be applied to the light emitting control lines EML1 to EMLn, in response to the second scan control signal SCS2.

The first scan driving circuit 420 may output the scan signals GI1 to GIk, which are to be applied to the scan lines GIL1 to GILn, in response to the second scan control signal SCS2.

The second scan driving circuit 430 may output the scan signals GC1 to GCs, which are to be applied to the scan lines GCL1 to GCLn, in response to the second scan control signal SCS2.

The third scan driving circuit 440 may output the scan signals GW1 to GWn, which are to be applied to the scan lines GWL1 to GWLn, in response to the second scan control signal SCS2.

Figure 9:
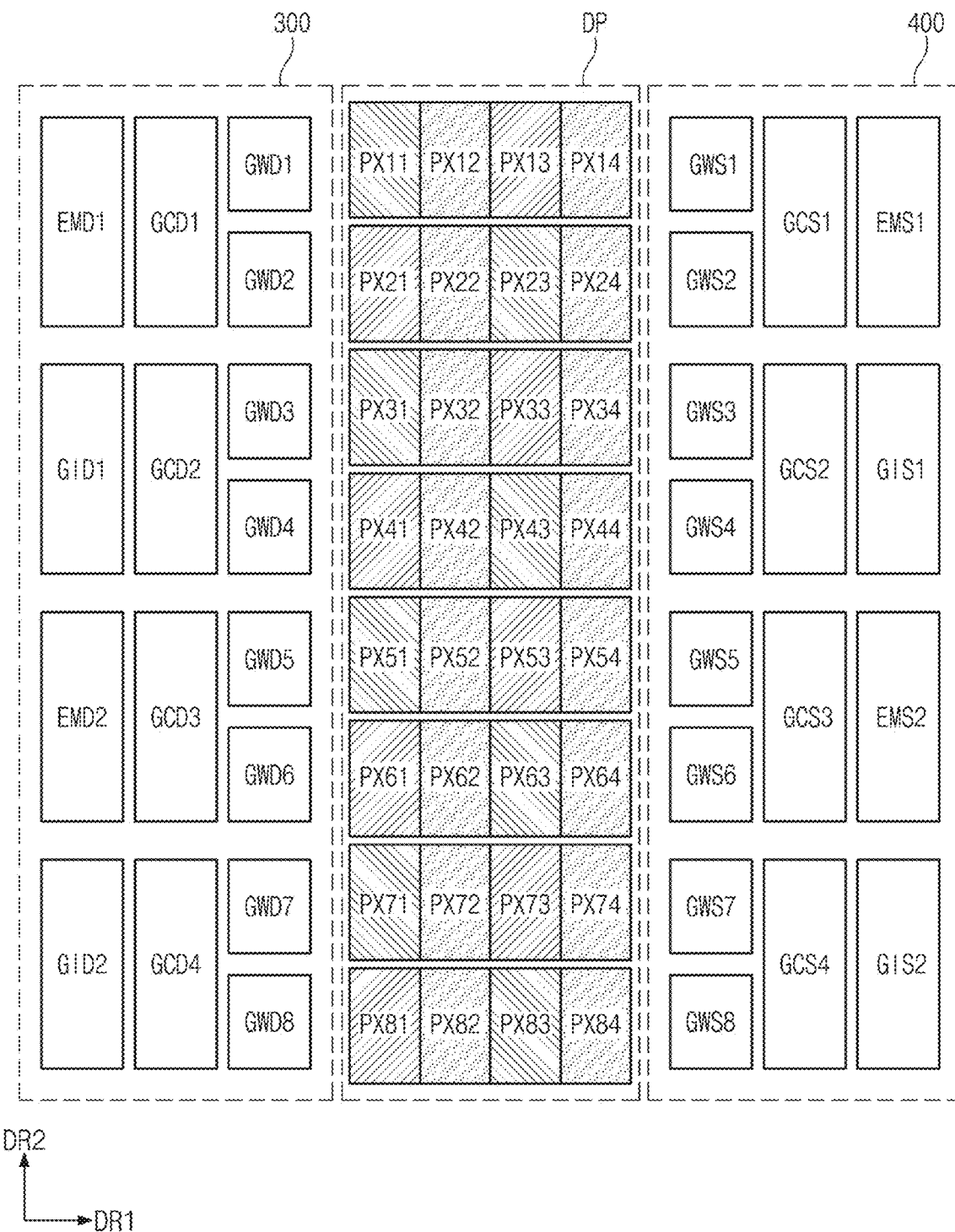
FIG. 9 is a block diagram showing the first driving circuit shown in FIG. 7 and the second driving circuit shown in FIG. 8.

FIG. 9 is a block diagram showing the first driving circuit 300 shown in FIG. 7 and the second driving circuit 400 shown in FIG. 8.

Referring to FIGS. 7 to 9, an embodiment of the display panel DP may include pixels PX11 to PX14, PX21 to PX24, PX31 to PX34, PX41 to PX44, PX51 to PX54, PX61 to PX64, PX71 to PX74, and PX81 to PX84.

For convenience of illustration and description, FIG. 9 shows thirty-two pixels arranged in a matrix form in eight rows and four columns, i.e., an arrangement of eight pixels in the second direction DR2 and four pixels in the first direction DR1, however, the number of the pixels included in the display panel DP may be modified in various ways.

Each of the pixels PX11, PX23, PX31, PX43, PX51, PX63, PX71, and PX83 may be a first color pixel, e.g., a red pixel, each of the pixels PX13, PX21, PX33, PX41, PX53, PX61, PX73, and PX81 may be a second color pixel, e.g., a blue pixel, and each of the pixels PX12, PX14, PX22, PX24, PX32, PX34, PX42, PX44, PX52, PX54, PX62, PX64, PX72, PX74, PX82, and PX84 may be a third color pixel, e.g., a green pixel.

The light emitting driving circuit 310 of the first driving circuit 300 may include light emitting stages EMD1 and EMD2. The first scan driving circuit 320 of the first driving circuit 300 may include first scan stages GID1 and GID2. The second scan driving circuit 330 of the first driving circuit 300 may include second scan stages GCD1 and GCD4. The third scan driving circuit 340 of the first driving circuit 300 may include third scan stages GWD1 to GWD8.

The light emitting stage EMD1 of the first driving circuit 300 may drive the pixels PX11 to PX14, PX21 to PX24, PX31 to PX34, and PX41 to PX44 arranged in four rows.

The light emitting stage EMD2 of the first driving circuit 300 may drive the pixels PX51 to PX54, PX61 to PX64, PX71 to PX74, and PX81 to PX84 arranged in four rows.

The first scan stage GID1 of the first driving circuit 300 may drive the pixels PX11 to PX14, PX21 to PX24, PX31 to PX34, and PX41 to PX44 arranged in four rows.

The first scan stage GID2 of the first driving circuit 300 may drive the pixels PX51 to PX54, PX61 to PX64, PX71 to PX74, and PX81 to PX84 arranged in four rows.

The second scan stages GCD1 to GCD4 of the first driving circuit 300 may respectively drive the pixels PX11 PX84 arranged in two rows.

The third scan stages GWD1 to GWD8 of the first driving circuit 300 may respectively drive the pixels PX11 to PX84 arranged in one row.

Each of the light emitting stages EMD1 and EMD2, the first scan stages GID1 and GID2, and the second scan stages GCD1 to GCD4 of the first driving circuit 300 may have substantially a same length in the second direction DR2 as each other. According to an embodiment, each of the light emitting stages EMD1 and EMD2, the first scan stages GID1 and GID2, and the second scan stages GCD1 to GCD4 of the first driving circuit 300 may have substantially a same circuit area as each other.

A length in the second direction DR2 of each of the third scan stages GWD1 to GWD8 of the first driving circuit 300 may be about a half (about ½) of the length in the second direction DR2 of each of the second scan stages GCD1 to GCD4 of the first driving circuit 300. The circuit areas in which the third scan stages GWD1 to GWD8 of the first driving circuit 300 are respectively disposed may be smaller than the circuit areas in which the light emitting stages EMD1 to EMD2, the first scan stages GID1 to GID2, and the second scan stages GCD1 to GCD4 of the first driving circuit 300 are respectively disposed.

The light emitting driving circuit 410 of the second driving circuit 400 may include light emitting stages EMS1 and EMS2. The first scan driving circuit 420 of the second driving circuit 400 may include first scan stages GIS1 and GIS2. The second scan driving circuit 430 of the second driving circuit 400 may include second scan stages GCS1 to GCS4. The third scan driving circuit 440 of the second driving circuit 400 may include third scan stages GWS1 to GWS8.

The light emitting stage EMS1 of the second driving circuit 400 may drive the pixels PX11 to PX14, PX21 to PX24, PX31 to PX34, and PX41 to PX44 arranged in four rows.

The light emitting stage EMS2 of the second driving circuit 400 may drive the pixels PX51 to PX54, PX61 to PX64, PX71 to PX74, and PX81 to PX84 arranged in four rows.

The first scan stage GIS1 of the second driving circuit 400 may drive the pixels PX11 to PX14, PX21 to PX24, PX31 to PX34, and PX41 to PX44 arranged in four rows.

The first scan stage GIS2 of the second driving circuit 400 may drive the pixels PX51 to PX54, PX61 to PX64, PX71 to PX74, and PX81 to PX84 arranged in four rows.

The second scan stages GCS1 to GCS4 of the second driving circuit 400 may respectively drive the pixels PX11 to PX84 arranged in two rows.

The third scan stages GWS1 to GWS8 of the second driving circuit 400 may respectively drive the pixels PX11 to PX84 arranged in one row.

Each of the light emitting stages EMS1 and EMS2, the first scan stages GIS1 and GIS2, and the second scan stages GCS1 to GCS4 of the second driving circuit 400 may have substantially a same length in the second direction DR2 as each other. According to an embodiment, each of the light emitting stages EMS1 and EMS2, the first scan stages GIS1 and GIS2, and the second scan stages GCS1 to GCS4 of the second driving circuit 400 may have substantially a same circuit area as each other.

A length in the second direction DR2 of each of the third scan stages GWS1 to GWS8 of the second driving circuit 400 may be about a half (about ½) of the length in the second direction DR2 of each of the second scan stages GCS1 to GCS4 of the second driving circuit 400.

The circuit areas in which the third scan stages GWS1 to GWS8 of the second driving circuit 400 are respectively disposed may be smaller than the circuit areas in which the light emitting stages EMS1 and EMS2, the first scan stages GIS1 to GIS2, and the second scan stages GCS1 to GCS4 of the second driving circuit 400 are respectively disposed.

In an embodiment, as shown in FIG. 9, the first scan stages GID1 and GID2 and the second scan stages GCD1 to GCD4 of the first driving circuit 300 may have independent (or separate) circuit configurations from each other. In such an embodiment, the first scan stages GIS1 and GIS2 and the second scan stages GCS1 to GCS4 of the second driving circuit 400 may have independent (separate) circuit configurations from each other.

Figure 10:
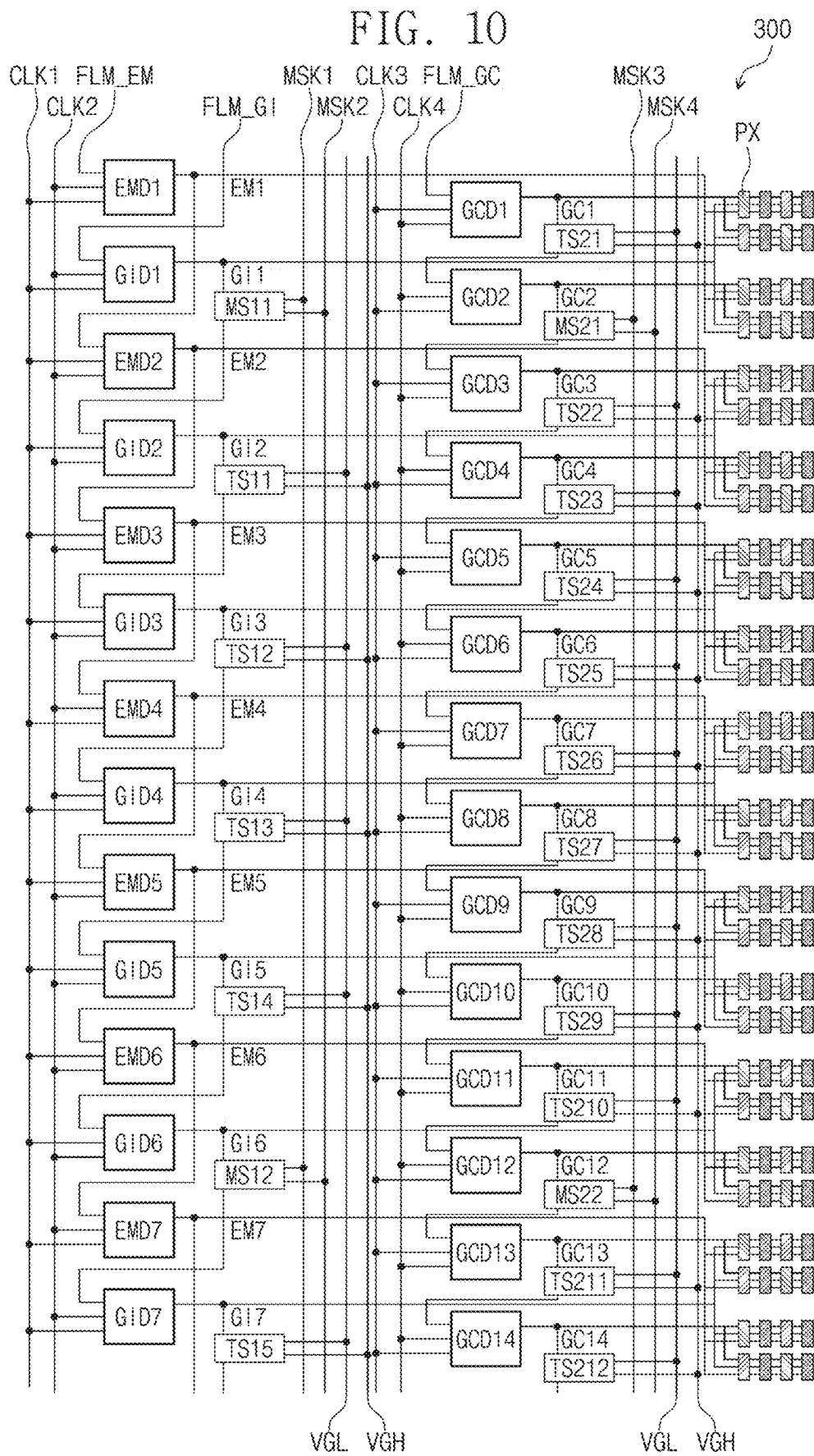
FIG. 10 is a view showing an embodiment of light emitting stages, first scan stages, and second scan stages in the first driving circuit.

FIG. 10 shows an embodiment of light emitting stages EMD1 to EMD7, first scan stages GID1 to GID7, and second scan stages GCD1 to GCD14 of the first driving circuit 300.

Referring to FIGS. 9 and 10, an embodiment of the first driving circuit 300 may further include a plurality of masking circuits MS11, MS12, MS21, and MS22 and a plurality of transmission circuits TS11 to TS15 and TS21 to TS212.

The masking circuits MS11, MS12, MS21, and MS22 may be electrically connected to some of the scan stages GID1 to GID7 and GCD1 to GCD14, respectively. The transmission circuits TS11 to TS15 and TS21 to TS212 may be electrically connected to others of the scan stages GID1 to GID7 and GCD1 to GCD14, respectively.

Each of the light emitting stages EMD1 to EMD7 may receive a first clock signal CLK1, a second clock signal CLK2, and a carry signal and may output the light emitting control signals EM1 to EM7.

Each of the light emitting control signals EM1 to EM7 may be commonly applied to the pixels PX arranged in four rows along the second direction DR2. In one embodiment, for example, the light emitting control signal EM1 output from the light emitting stage EMD1 may be applied to the pixels PX arranged in the first to fourth rows.

The first light emitting stage EMD1 may receive a start signal FLM_EM as the carry signal. Each of the light emitting stages EMD2 to EMD7 except the first light emitting stage EMD1 may receive a light emitting control signal output from a previous light emitting stage as the carry signal. In one embodiment, for example, a second light emitting stage EMD2 may receive the light emitting control signal EM1 output from the first light emitting stage EMD1 as the carry signal.

The masking circuit MS11 may selectively output a scan signal GI1 output from a first first scan stage GID1 as a masking carry signal in response to a first masking signal MSK1 and a second masking signal MSK2.

The masking circuit MS12 may selectively output a scan signal GI6 output from a sixth first scan stage GID6 as the masking carry signal in response to the first masking signal MSK1 and the second masking signal MSK2.

The masking circuit MS21 may selectively output a scan signal GC2 output from a second second scan stage GCD2 as the masking carry signal in response to a third masking signal MSK3 and a fourth masking signal MSK4.

The masking circuit MS22 may selectively output a scan signal GC12 output from a twelfth second scan stage GID12 as the masking carry signal in response to the third masking signal MSK3 and the fourth masking signal MSK4.

The transmission circuit TS11 may output a scan signal GI2 output from a second first scan stage GID2 as the carry signal in response to a first voltage VGL and a second voltage VGH. The first voltage VGL and the second voltage VGH may be provided from the voltage generator 500 (refer to FIG. 4).

The transmission circuit TS12 may output a scan signal GI3 output from a third first scan stage GID3 as the carry signal in response to the first voltage VGL and the second voltage VGH.

The transmission circuit TS13 may output a scan signal GI4 output from a fourth first scan stage GID4 as the carry signal in response to the first voltage VGL and the second voltage VGH.

The transmission circuit TS14 may output a scan signal GIS output from a fifth first scan stage GID5 as the carry signal in response to the first voltage VGL and the second voltage VGH.

The transmission circuit TS15 may output a scan signal GI7 output from a seventh first scan stage GID7 as the carry signal in response to the first voltage VGL and the second voltage VGH.

The transmission circuit TS21 may output a scan signal GC1 output from a first second scan stage GCD1 as the carry signal in response to the first voltage VGL and the second voltage VGH.

The transmission circuit TS22 may output a scan signal GC3 output from a third second scan stage GCD3 as the carry signal in response to the first voltage VGL and the second voltage VGH.

The transmission circuit TS23 may output a scan signal GC4 output from a fourth second scan stage GCD4 as the carry signal in response to the first voltage VGL and the second voltage VGH.

The transmission circuit TS24 may output a scan signal GC5 output from a fifth second scan stage GCD5 as the carry signal in response to the first voltage VGL and the second voltage VGH.

The transmission circuit TS25 may output a scan signal GC6 output from a sixth second scan stage GCD6 as the carry signal in response to the first voltage VGL and the second voltage VGH.

The transmission circuit TS26 may output a scan signal GC7 output from a seventh second scan stage GCD7 as the carry signal in response to the first voltage VGL and the second voltage VGH.

The transmission circuit TS27 may output a scan signal GC8 output from an eighth second scan stage GCD8 as the carry signal in response to the first voltage VGL and the second voltage VGH.

The transmission circuit TS28 may output a scan signal GC9 output from a ninth second scan stage GCD9 as the carry signal in response to the first voltage VGL and the second voltage VGH.

The transmission circuit TS29 may output a scan signal GC10 output from a tenth second scan stage GCD10 as the carry signal in response to the first voltage VGL and the second voltage VGH.

The transmission circuit TS210 may output a scan signal GC11 output from an eleventh second scan stage GCD11 as the carry signal in response to the first voltage VGL and the second voltage VGH.

The transmission circuit TS211 may output a scan signal GC13 output from a thirteenth second scan stage GCD13 as the carry signal in response to the first voltage VGL and the second voltage VGH.

The transmission circuit TS212 may output a scan signal GC14 output from a fourteenth second scan stage GCD14 as the carry signal in response to the first voltage VGL and the second voltage VGH.

FIG. 10 shows one embodiment having a structure in which the masking circuits MS11 and MS12 are electrically connected to the first and sixth first scan stages GID1 and GID6, respectively, for example, however, the first scan stages to which the masking circuits MS11 and MS12 are electrically connected are not limited thereto or thereby and may be modified in various ways depending on a design of the circuit. FIG. 10 shows one embodiment having a structure in which the masking circuits MS21 and MS22 are electrically connected to the second and twelfth second scan stages GCD2 and GCD12, respectively, however, the second scan stages to which the masking circuits MS21 and MS22 are electrically connected are not limited thereto or thereby and may be modified in various ways depending on a design of the circuit.

Each of the first scan stages GID1 to GID7 may receive the first clock signal CLK1, the second clock signal CLK2, and the carry signal and may output the scan signals GI1 to GI7.

Each of the scan signals GI1 to GI7 may be commonly applied to the pixels PX arranged in four rows in the second direction DR2. In one embodiment, for example, the scan signal GI1 output from the first scan stage GID1 may be applied to the pixels PX arranged in the first to fourth rows.

The first scan stage GID1 may receive a start signal FLM_GI as the carry signal. The second first scan stage GID2 may receive the masking carry signal output from the masking circuit MS11. The seventh first scan stage GID7 may receive the masking carry signal output from the masking circuit MS12. The first scan stages GID3, GID4, GID5, and GID6 except the first scan stages GID1, GID2, and GID7 may receive the scan signal output from each of the transmission circuits TS11 to TS14 as the carry signal.

Each of the second scan stages GCD1 to GCD14 may receive the first clock signal CLK1, the second clock signal CLK2, and the carry signal and may output the scan signals GC1 to GC14.

Each of the scan signals GC1 to GC14 may be commonly applied to the pixels PX arranged in two rows in the second direction DR2. In one embodiment, for example, the scan signal GC1 output from the second scan stage GCD1 may be applied to the pixels PX arranged in the first and second rows.

The second scan stage GCD1 may receive a start signal FLM_GC as the carry signal. The second second scan stage GCD2 may receive the masking carry signal output from the masking circuit MS21. The fourteenth second scan stage GCD14 may receive the masking carry signal output from the masking circuit MS22. The second scan stages GCD3 to GCD13 except the second scan stages GCD1, GCD2, and GCD14 may receive the scan signal output from each of the transmission circuits TS21 to TS212 as the carry signal.

The masking circuits MS11, MS12, MS21, and MS22 and the transmission circuits TS11 to TS15 and TS21 to TS212 may have substantially the same circuit area as each other.

In a case where the transmission circuits TS21 to TS212 are not disposed, areas in which the scan stages are disposed may have different circuit densities depending on whether the masking circuits are disposed or not. In this case, a difference in characteristics between transistors of the circuit may occur. In an embodiment of the invention, the first driving circuit 300 may include the plural masking circuits MS11, MS12, MS21, and MS22 and the plural transmission circuits TS11 to TS15 and TS21 to TS212. In such an embodiment, the masking circuits MS11, MS12, MS21, and MS22 may be electrically connected to some of the scan stages GID1 to GID7 and GCD1 to GCD14, respectively. In such an embodiment, the transmission circuits TS11 to TS15 and TS21 to TS212 may be electrically connected to others of the scan stages GID1 to GID7 and GCD1 to GCD14, respectively. Accordingly, in such an embodiment, the areas in which the scan stages GID1 to GID7 and GCD1 to GCD14 are disposed may include the same number of transistors and may have the same circuit density as each other. In such an embodiment, the same load may be applied to the areas, and the scan stages GID1 to GID7 and GCD1 to GCD14 arranged in the areas may have the same characteristics as each other. Accordingly, in such an embodiment, a difference in brightness between rows in which the pixels PX are arranged may be reduced, and a crosstalk phenomenon in which an image quality of the display panel DP decreases due to different electrical interference between the pixels PX may be reduced.

In an embodiment, as shown in FIG. 10, the masking circuits MS11 and MS12 are alternately disposed every five first scan stages among the first scan stages GID1 to GID7, and the masking circuits MS21 and MS22 are alternately disposed every five first scan stages among the second scan stages GCD1 to GCD14. However, the disclosure is not limited to the embodiment shown in FIG. 10, and positions of the masking circuits MS11, MS12, MS21, and MS22 may be modified in various ways.

In FIG. 10, for convenience of illustration, the third scan stages of the third scan driving circuit 340 (refer to FIG. 7) are not shown, however, the third scan stages may have substantially the same configuration as that of the first scan stages GID1 to GID7 and the second scan stages GCD1 to GCD14.

In an embodiment, the second driving circuit 400 (refer to FIG. 8) may have a circuit configuration similar to that of the first driving circuit 300 shown in FIG. 10.

Figure 11:
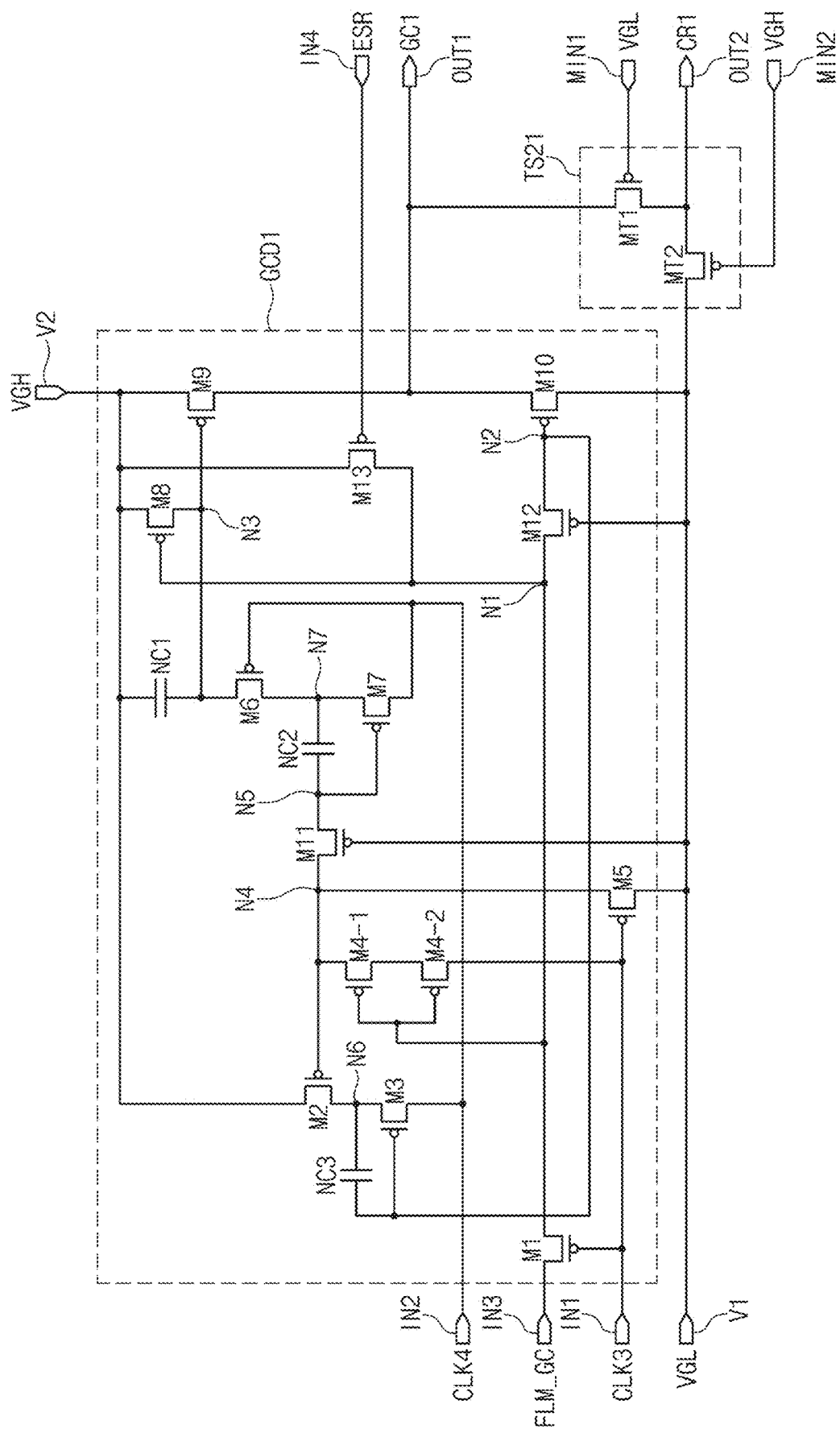
FIG. 11 is a circuit diagram showing a first second scan stage and a transmission circuit in a first driving circuit according to an embodiment of the disclosure.

FIG. 11 is a circuit diagram showing the first second scan stage and the transmission circuit in the first driving circuit according to an embodiment of the disclosure.

FIG. 11 shows an embodiment of the second scan stage GCD1 and the transmission circuit TS21 shown in FIG. 10. Each of the second scan stages GCD1 to GCD14 shown in FIG. 10 may have substantially the same circuit configuration as that of the first second scan stage GCD1 shown in FIG. 11. Each of the transmission circuits TS21 to TS212 shown in FIG. 10 may have substantially the same circuit configuration as that of the transmission circuit TS21 shown in FIG. 11.

Referring to FIG. 11, the second scan stage GCD1 may include first, second, third, and fourth input terminals IN1, IN2, IN3, and IN4, first and second voltage terminals V1 and V2, a scan output terminal OUT1, transistors M1, M2, M3, M4, M5, M6, M7, M8, M9, M10, M11, M12, and M13, and capacitors NC1, NC2, and NC3. In an embodiment, as shown in FIG. 11, each of the transistors M1 to M13 may be a P-type transistor, but the disclosure is not limited thereto or thereby. In one alternative embodiment, for example, some or all of the transistors M1 to M13 may be an N-type transistor.

In an embodiment, the second scan stage GCD1 may receive a third clock signal CLK3, a fourth clock signal CLK4, and the start signal FLM_GC via the first to third input terminals IN1 to IN3 and may receive the first voltage VGL and the second voltage VGH via the first and second voltage terminals V1 and V2. The second scan stage GCD1 may output the scan signal GC1 via the scan output terminal OUT1.

In each of some scan stages among the second scan stages GCD1 to GCD14 shown in FIG. 10, for example, odd-numbered scan stages, the first input terminal IN1 may receive the third clock signal CLK3, and the second input terminal IN2 may receive the fourth clock signal CLK4. In addition, in each of some scan stages among the second scan stages GCD1 to GCD14, for example, even-numbered scan stages, the first input terminal IN1 may receive the fourth clock signal CLK4, and the second input terminal IN2 may receive the third clock signal CLK3.

The transistor M1 may be connected between the third input terminal IN3 and a first node N1 and may include a gate electrode connected to the third input terminal IN3. The transistor M2 may be connected between the second voltage terminal V2 and a sixth node N6 and may include a gate electrode connected to a fourth node N4. The transistor M3 may be connected between the sixth node N6 and the second input terminal IN2 and may include a gate electrode connected to a second node N2.

Transistors M4-1 and M4-2 may be connected between the fourth node N4 and the first input terminal IN1 and connected to each other in series. Each of the transistors M4-1 and M4-2 may include a gate electrode connected to the first node N1. The transistor M5 may be connected between the fourth node N4 and the first voltage terminal V1 and may include a gate electrode connected to the first input terminal IN1. The transistor M6 may be connected between a third node N3 and a seventh node N7 and may include a gate electrode connected to the second input terminal IN2.

The transistor M7 may be connected between the seventh node N7 and the second input terminal IN2 and may include a gate electrode connected to a fifth node N5.

The transistor M8 may be connected between the second voltage terminal V2 and the third node N3 and may include a gate electrode connected to the first node N1. The transistor M9 may be connected between the second voltage terminal V2 and the scan output terminal OUT1 and may include a gate electrode connected to the third node N3. The transistor M10 may be connected between the scan output terminal OUT1 and the first voltage terminal V1 and may include a gate electrode connected to the second node N2. The transistor M11 may be connected between the fourth node N4 and the fifth node N5 and may include a gate electrode connected to the first voltage terminal V1. The transistor M12 may be connected between the first node N1 and the second node N2 and may include a gate electrode connected to the first voltage terminal V1.

The transistor M13 may be connected between the second voltage terminal V2 and the first node N1 and may include a gate electrode connected to the fourth input terminal IN4. The fourth input terminal IN4 may receive a reset signal ESR. The reset signal ESR may be a signal included in the first scan control signal SCS1 (refer to FIG. 4) and the second scan control signal SCS2 (refer to FIG. 4), which are provided from the driving controller 100 (refer to FIG. 4).

The reset signal ESR may be activated to a low level when the electronic device DD (refer to FIG. 1) is powered on or reset. When the reset signal ESR is at the low level, the transistor M13 may be turned on, and the first node N1 and the second node N2 may be maintained at a voltage level of the second voltage VGH, i.e., a high level. Accordingly, the transistors M3, M4-1, M4-2, M8, and M10 are maintained in a turned-off state, and the scan signal GC1 output via the scan output terminal OUT1 may be prevented from being output at an undesired level.

The capacitor NC1 may be connected between the second voltage terminal V2 and the third node N3. The capacitor NC2 may be connected between the fifth node N5 and the seventh node N7. The capacitor NC3 may be connected between the sixth node N6 and the second node N2.

The transmission circuit TS21 may include first and second transmission transistors MT1 and MT2, first and second input terminals MIN1 and MIN2, and a carry output terminal OUT2.

The transmission circuit TS21 may output a carry signal CR1 in response to the first voltage VGL applied thereto via the first input terminal MIN1. The transmission circuit TS21 may prevent the carry signal CR1 from being set to the first voltage VGL in response to the second voltage VGH applied thereto via the second input terminal MIN2. In one embodiment, for example, the first transmission transistor MT1 may be always maintained in an on-state, and the second transmission transistor MT2 may be always maintained in an off-state.

The first transmission transistor MT1 may be connected between the scan output terminal OUT1 and the carry output terminal OUT2 and may include a gate electrode to which the first voltage VGL is applied. The second transmission transistor MT2 may be connected between the first voltage terminal V1 and the carry output terminal OUT2 and may include a gate electrode to which the second voltage VGH is applied.

Figure 12:
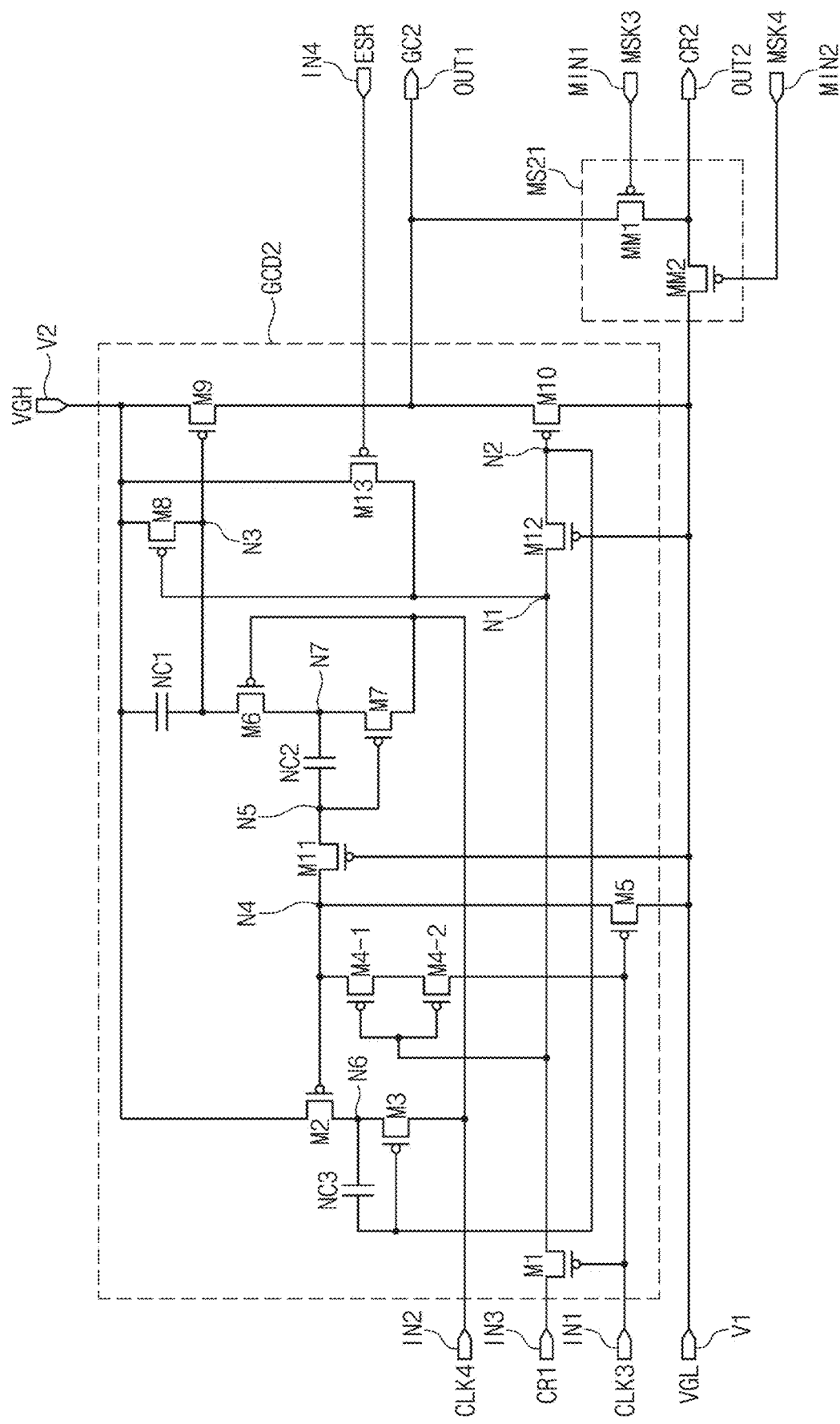
FIG. 12 is a circuit diagram showing a second second scan stage and a masking circuit in a first driving circuit according to an embodiment of the disclosure.

FIG. 12 is a circuit diagram showing a second scan stage and a masking circuit in a first driving circuit according to an embodiment of the disclosure. In FIG. 12, the same reference numerals denote the same elements in FIG. 11, and thus, any repetitive detailed descriptions of the same elements will be omitted.

Referring to FIG. 12, the second scan stage GCD2 may receive a third clock signal CLK3, a fourth clock signal CLK4, and a carry signal CR1 via first, second, and third input terminals IN1, IN2, and IN3. The second scan stage GCD2 may output a scan signal GC2 via a scan output terminal OUT1. The carry signal CR1 input via the third input terminal IN3 may be a scan signal GI2 output from a first second scan stage GCD1.

A masking circuit MS21 may include first and second masking transistors MM1 and MM2, first and second input terminals MIN1 and MIN2, and a carry output terminal OUT2.

The masking circuit MS21 may stop or mask outputting of a carry signal CR2 in response to a third masking signal MSK3 applied thereto via the first input terminal MIN1 and may set the carry signal CR2 as a first voltage VGL in response to a fourth masking signal MSK4 applied thereto via the second input terminal MIN2.

The first masking transistor MM1 may be connected between the scan output terminal OUT1 and the carry output terminal OUT2 and may include a gate electrode connected to the first input terminal MIN1. The second masking transistor MM2 may be connected between a first voltage terminal V1 and the carry output terminal OUT2 and may include a gate electrode connected to the second input terminal MIN2.

When the third masking signal MSK3 provided via the first input terminal MIN1 has a low level and the fourth masking signal MSK4 provided via the second input terminal MIN2 has a high level, the masking circuit MS21 may output the scan signal GC2 as the carry signal CR2.

When the third masking signal MSK3 provided via the first input terminal MIN1 has the high level and the fourth masking signal MSK4 provided via the second input terminal MIN2 has the low level, the masking circuit MS21 may not output the scan signal GC2 as the carry signal CR2, and the carry signal CR2 may be maintained at the first voltage VGL.

Figure 13A:
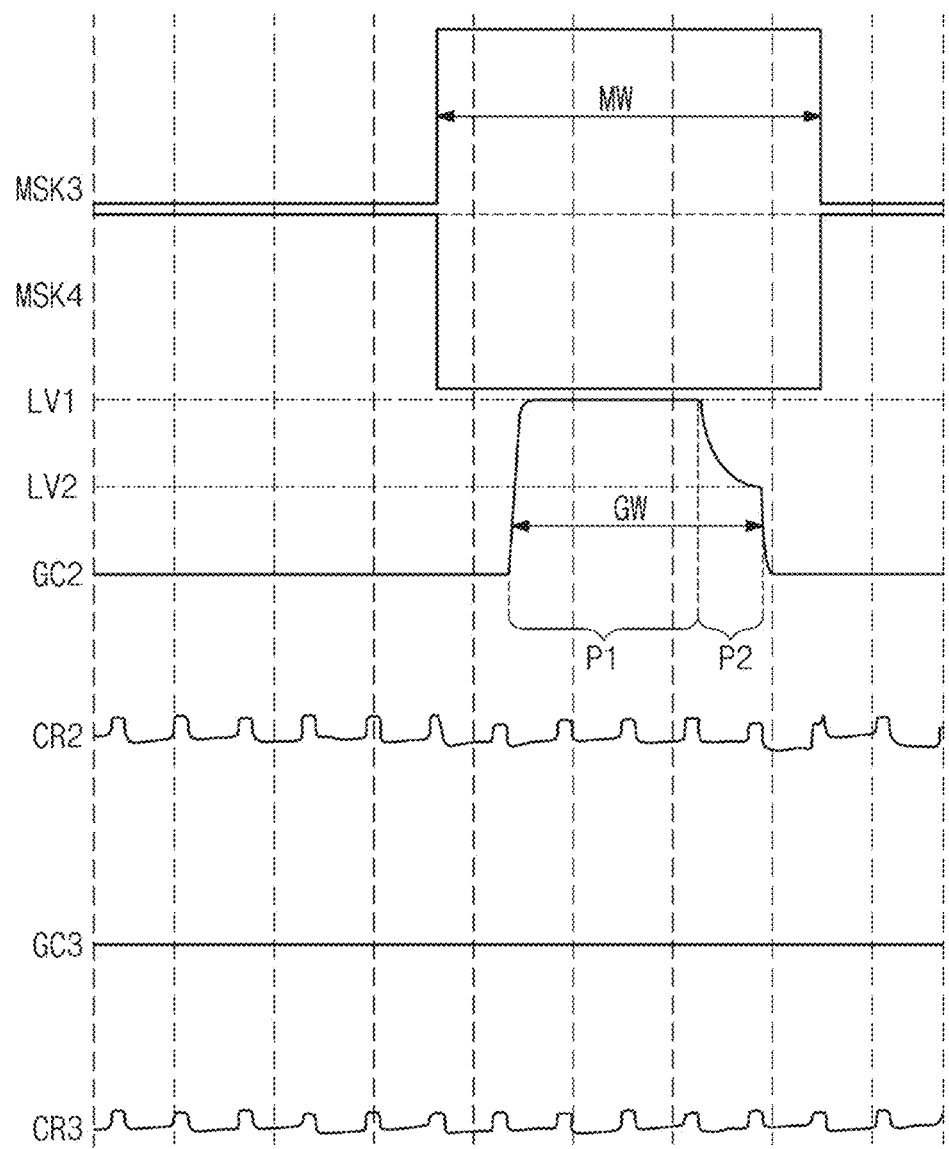
FIG. 13A is a waveform diagram showing a masking signal, a scan signal, and a carry signal according to an embodiment of the disclosure.
Figure 13B:
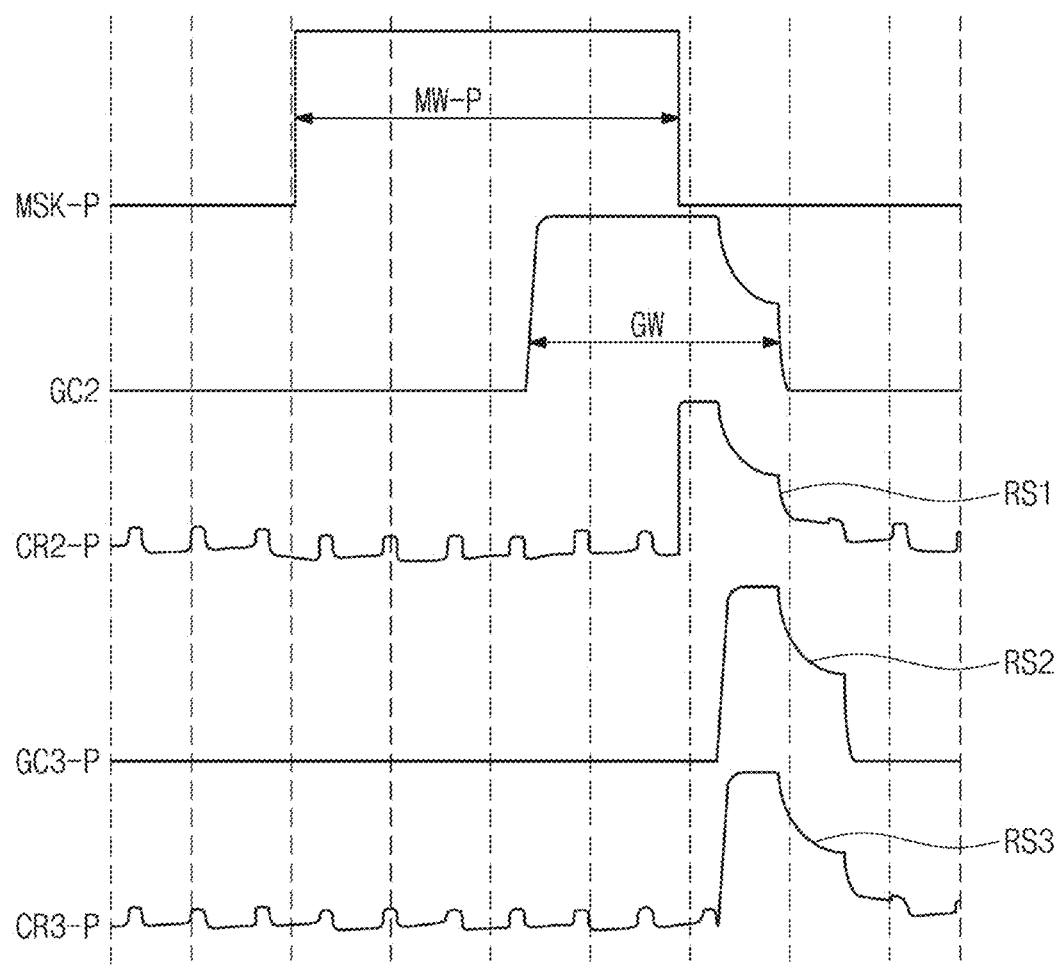
FIG. 13B is a waveform diagram showing signals of a comparative example.

FIG. 13A is a waveform diagram showing the masking signal, the scan signal, and the carry signal according to an embodiment of the disclosure. FIG. 13B is a waveform diagram showing signals according to a comparative example.

Referring to FIGS. 10 to 13A, in an embodiment, the scan signal GC2 may include a first portion P1 having a first level LV1 and a second portion P2 subsequent to or provided after the first portion P1 and having a second level LV2 lower than the first level LV1.

According to an embodiment of the disclosure, each of the scan signals may include the first portion P1 and the second portion P2. In such an embodiment, a size of the circuit for providing the scan signals may decrease due to the second portion P2 having the second level LV2 lower than the first level LV1. In such an embodiment, the size of the scan driving circuits 320, 330, and 340 (refer to FIG. 7) may decrease. Accordingly, the non-display area NDA (refer to FIG. 1) of the electronic device DD (refer to FIG. 1) may decrease.

Each of the third masking signal MSK3 and the fourth masking signal MSK4 may have a width MW greater than a width GW of the scan signal GC2. In one embodiment, for example, a width of a signal may mean a time duration when the signal is at high level or a time duration when the signal is at low level.

The third masking signal MSK3 and the fourth masking signal MSK4 may cover (or overlap an entire portion of) the scan signal GC2. The third masking signal MSK3 and the fourth masking signal MSK4 may overlap the scan signal GC2.

The masking circuit MS21 may stop or mask outputting of the scan signal GC2 as the carry signal CR2 when the third masking signal MSK3 provided via the first input terminal MIN1 has the high level.

The masking circuit MS21 may set the carry signal CR2 as the first voltage VGL when the fourth masking signal MSK4 provided via the second input terminal MIN2 has the low level.

The scan signal GC3 output from the second scan stage GCD3 which receives the carry signal CR2 set as the first voltage VGL may be maintained at low level. Accordingly, a carry signal CR3 output from the transmission circuit TS22 may be maintained at low level.

FIG. 13A shows an embodiment of a method of driving the electronic device in the multi-frequency mode MFM (refer to FIG. 2B) by controlling the masking circuit MS21 electrically connected to the second scan stage GCD2, but not being limited thereto or thereby. In one alternative embodiment, for example, the electronic device may be driven in the multi-frequency mode MFM (refer to FIG. 2B) by controlling the masking circuit MS22 electrically connected to the second scan stage GCD12, and in this case, a length in the second direction DR2 of the second display area DA2 (refer to FIG. 1) may increase. In such an embodiment, the length in the second direction DR2 of the first display area DA1 (refer to FIG. 1) and the second display area DA2 (refer to FIG. 1) may be adjusted based on a signal level of the third and fourth masking signals MSK3 and MSK4.

FIG. 13A shows only the scan signals GC2 and GC3 for convenience of illustration, however, the first and third scan driving circuits 320 and 340 (refer to FIG. 7) and the first and third scan driving circuits 420 and 440 (refer to FIG. 8) may drive the scan signals GC1 and GW1 similar to the scan signals GC2 and GC3.

In a comparative example, referring to FIG. 13B, a third masking signal MSK-P may have a width MW-P equal to or smaller than the width GW of the scan signal GC2, differently from an embodiment of the invention. In the comparative example, the third masking signal MSK-P may not cover (or overlap an entire portion of) the scan signal GC2. The masking circuit MS21 which receives the third masking signal MSK-P may only partially stop or mask outputting of the scan signal GC2 as a carry signal CR2-P and may output a first residual carry signal RS1. A scan signal GC3-P output from the second scan stage GCD3 which receives the carry signal CR2-P including the residual carry signal RS1 may include a residual scan signal RS2. The carry signal CR3-P output from the transmission circuit TS22 may include a second residual carry signal RS3. In the comparative example, a difference in brightness between rows in which the pixels PX are arranged may occur since the first residual carry signal RS1 affects a waveform of the scan signal GC3-P. However, according to an embodiment of the disclosure, the third masking signal MSK3 and the fourth masking signal MSK4 may cover (or overlap an entire portion of) the scan signal GC2. The masking circuit MS21 may stop or mask outputting of the scan signal GC2 as the carry signal CR2. The carry signal CR3 output from the transmission circuit TS22 may be maintained at low level. Accordingly, the brightness difference may be effectively prevented from occurring between the rows in which the pixels PX are arranged.

In a comparative example, as shown in FIG. 13B, the third masking signal MSK-P may have the width MW-P greater than the width GW of the scan signal GC2, but the third masking signal MSK-P may not cover the scan signal GC2. The masking circuit MS21 which receives the third masking signal MSK-P may only partially stop or mask outputting of the scan signal GC2 as the carry signal CR2-P and may output the first residual carry signal RS1. Accordingly, the first residual carry signal RS1 may affect the waveform of the scan signal GC3-P, and thus, the brightness difference may occur between the rows in which the pixels PX are arranged. However, according to an embodiment of the disclosure, the third masking signal MSK3 and the fourth masking signal MSK4 may cover (or overlap an entire portion of) the scan signal GC2. The masking circuit MS21 may stop or mask outputting of the scan signal GC2 as the carry signal CR2. The carry signal CR3 output from the transmission circuit TS22 may be maintained at low level. Accordingly, the brightness difference may be effectively prevented from occurring between the rows in which the pixels PX are arranged.

Figure 14:
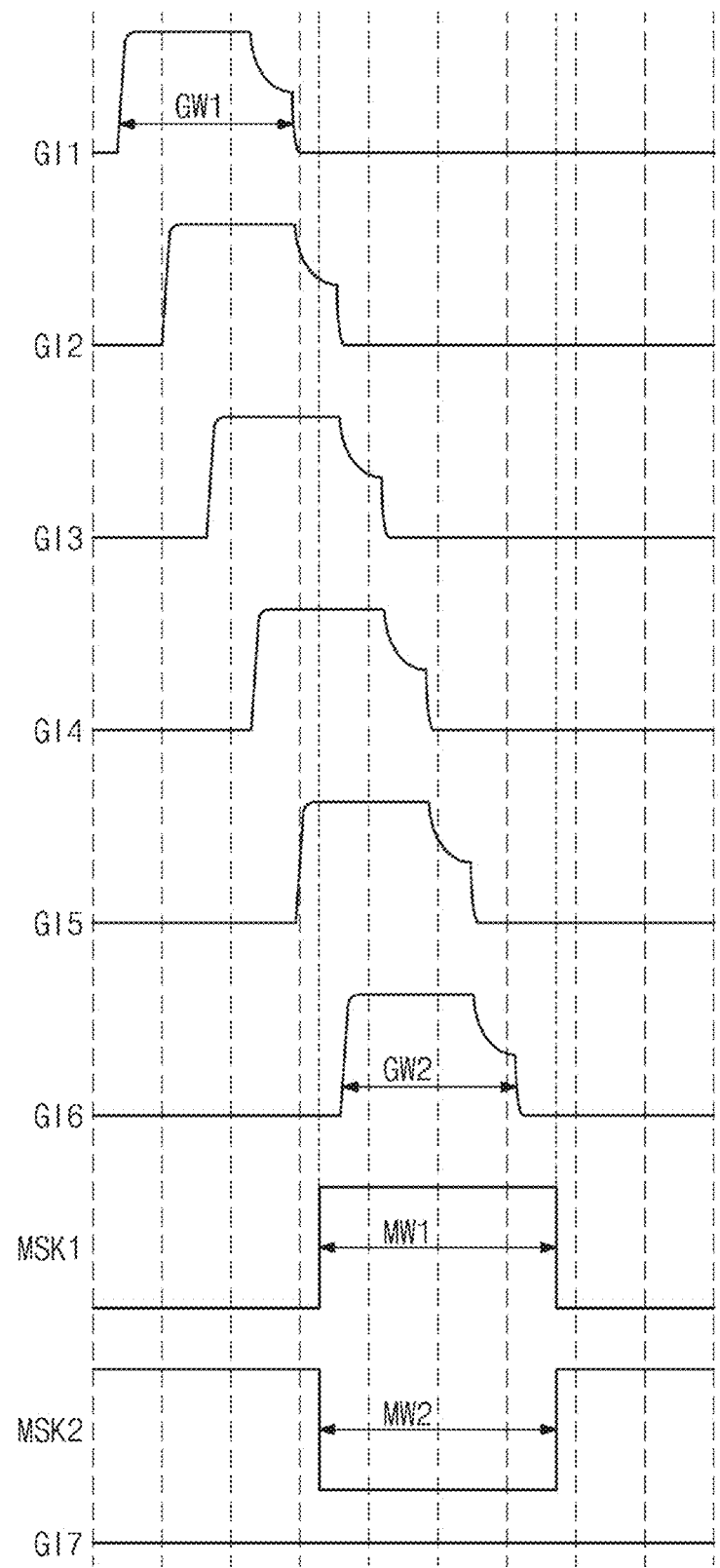
FIG. 14 is a waveform diagram showing a masking signal and a scan signal according to an embodiment of the disclosure.

FIG. 14 is a waveform diagram showing the masking signal and the scan signal according to an embodiment of the disclosure.

Referring to FIGS. 10 to 14, in an embodiment, the scan signal GI1 output from the first scan stage GID1 electrically connected to the masking circuit MS11 may have a first width GW1. The scan signal GI6 output from the first scan stage GID6 electrically connected to the masking circuit MS12 may have a second width GW2. The first width GW1 may be substantially the same as the second width GW2.

The scan signal GI1 output from the first scan stage GID1 electrically connected to the masking circuit MS11 may not overlap the scan signal GI6 output from the first scan stage GID6 electrically connected to the masking circuit MS12.

The scan signal GI1 may not overlap the first masking signal MSK1 and the second masking signal MSK2. According to an embodiment of the disclosure, the scan signal GI1 may not be affected by the first masking signal MSK1 and the second masking signal MSK2. Accordingly, the brightness difference may be prevented from occurring between a pixel row to which the scan signal GI1 is provided and an adjacent pixel row, and the crosstalk phenomenon in which an image quality of the display panel DP decreases due to different electrical interference between the pixels PX may be reduced.

The first masking signal MSK1 may have a third width MW1. The second masking signal MSK2 may have a fourth width MW2. The third width MW1 may be substantially the same as the fourth width MW2.

The third width MW1 and the fourth width MW2 may be greater than the first width GW1 and the second width GW2.

The first masking signal MSK1 and the second masking signal MSK2 may cover (or overlap an entire portion of) the scan signal GI6. The first masking signal MSK1 and the second masking signal MSK2 may overlap the scan signal GI6.

When the first masking signal MSK1 has the high level, the masking circuit MS12 may stop or mask outputting of the scan signal GI6 as the carry signal. When the second masking signal MSK2 has the low level, the masking circuit MS12 may set the carry signal as the first voltage VGL.

The scan signal GI7 output from the first scan stage GID7 which receives the carry signal set as the first voltage VGL may be maintained at low level. Accordingly, the carry signal output from the transmission circuit TS15 may be maintained at low level.

FIG. 14 shows only the scan signals GI1 to GI7 for convenience of illustration, and the second and third scan driving circuits 330 and 340 (refer to FIG. 7) and the second and third scan driving circuits 430 and 440 (refer to FIG. 8) may provide the scan signals GC1 and GW1 (refer to FIG. 7) similar to the scan signals GI1 to GI7.

FIG. 15 is a waveform diagram showing scan signals in the multi-frequency mode according to an embodiment of the disclosure.

Referring to FIGS. 1 and 15, a frequency of the scan signals GI1 to GI1920 may be about 12 0 Hz in the multi-frequency mode MFM (refer to FIG. 3B), and a frequency of the scan signals GI1921 to GI3840 may be about 1 Hz in the multi-frequency mode MFM.

The scan signals GI1 to GI1920 may be activated at high level in each of first frame F1 to 120th frame F120, and the scan signals GI1921 to GI3840 may be activated at high level only in the first frame F1.

Accordingly, the first display area DA1 in which the video is displayed may be driven in response to the scan signals GI1 to GI1920 at a normal frequency, e.g., about 120 Hz, and the second display area DA2 in which the still image is displayed may be driven in response to the scan signals GI1921 to GI3840 at a low frequency, e.g., about 1 Hz. Since only the second display area DA2 in which the still image is displayed is driven at the low frequency, the power consumption of the electronic device DD (refer to FIG. 1) may be reduced without deterioration in display quality.

The scan signals GI1 to GI1920 may correspond to the first display area DA1 of the electronic device DD shown in FIG. 1, and the scan signals GI1921 to GI3840 may correspond to the second display area DA2 shown in FIG. 1, for example, and it will be understood that a range of the scan signals GI1 to GI3840 corresponding to each of the first display area DA1 and the second display area DA2 is not limited thereto or thereby. In one embodiment, for example, the size of the first display area DA1 driven at the normal frequency and the size of the second display area DA2 driven at the low frequency may be varied, and when the size of the second display area DA2 driven at the low frequency increases, the power consumption of the electronic device DD may be further reduced.

FIG. 15 shows only the scan signals GI1 to GI3840, for convenience of illustration, and it will be understood that the light emitting driving circuit 310 (refer to FIG. 7), the second scan driving circuit 330 (refer to FIG. 7), the third scan driving circuit 340 (refer to FIG. 7), the light emitting driving circuit 410 (refer to FIG. 8), the second scan driving circuit 430 (refer to FIG. 8), and the third scan driving circuit 440 (refer to FIG. 8) may generate scan signals GC1 to GC3840 and GW1 to GW3840 and light emitting signals EM1 to EM3840 similar to the scan signals GI1 to GI3840.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
   a display panel comprising a plurality of data lines, a plurality of scan lines, and a plurality of pixels connected to the data lines and the scan lines;
   a plurality of scan stages corresponding to the scan lines, wherein each of the scan stages receives clock signals and a carry signal, and outputs a scan signal;
   a plurality of masking circuits electrically connected to at least two scan stages among the scan stages, respectively, wherein each of the masking circuits receives a masking signal and outputs a masking carry signal in response to the masking signal and the scan signal of a corresponding stage connected thereto as the carry signal of a next stage of the corresponding stage connected thereto; and
   a plurality of transmission circuits electrically connected to remaining scan stages among the scan stages other than the at least two stages, respectively, wherein each of the transmission circuits does not receive the masking signal and outputs the scan signal output from a corresponding scan stage connected thereto as the carry signal of a next stage of the corresponding stage connected thereto.

2. The electronic device of claim 1, wherein the masking signal comprises a first masking signal and a second masking signal,
   each of the masking circuits outputs the scan signal output from the corresponding scan stage as the masking carry signal when the first masking signal has a first level and the second masking signal has a second level different from the first level, and
   each of the masking circuits does not output the scan signal output from the corresponding scan stage as the masking carry signal when the first masking signal has the second level and the second masking signal has the first level.

3. The electronic device of claim 2, wherein each of the masking circuits comprises:
   a first masking transistor connected between a terminal of the corresponding scan stage, from which the scan signal of the corresponding scan stage is output, and a carry output terminal, wherein the first masking transistor includes a first gate electrode which receives the first masking signal; and
   a second masking transistor connected between the carry output terminal and a first voltage terminal which receives a first voltage of the corresponding scan stage, wherein the second masking transistor includes a second gate electrode which receives the second masking signal.

4. The electronic device of claim 3, wherein each of the transmission circuits comprises:
   a first transmission transistor connected between the terminal of the corresponding scan stage and the carry output terminal, wherein the first transmission transistor includes a third gate electrode which receives the first voltage; and
   a second transmission transistor connected between the carry output terminal and the first voltage terminal, wherein the second transmission transistor includes a fourth gate electrode which receives a second voltage different from the first voltage.

5. The electronic device of claim 1, further comprising:
   a driving controller which drives the display panel in a multi-frequency mode and a normal mode.

6. The electronic device of claim 5, wherein
the display panel comprises a first display area and a second display area adjacent to the first display area,
the first display area is driven at a first driving frequency in the multi-frequency mode, and
the second display area is driven at a second driving frequency different from the first driving frequency in the multi-frequency mode.

7. The electronic device of claim 6, wherein the first driving frequency is higher than the second driving frequency.

8. The electronic device of claim 6, wherein the driving controller controls the scan stages and the masking circuits.

9. The electronic device of claim 6, wherein the driving controller substantially simultaneously displays a still image and a video through the first display area in the multi-frequency mode and changes the multi-frequency mode of the first display area to the normal mode when a time duration of the still image reaches a predetermined time.

10. The electronic device of claim 1, wherein areas in which the masking circuits are respectively disposed are the same as areas in which the transmission circuits are respectively disposed.

11. The electronic device of claim 1, further comprising:
a plurality of light emitting stages,
wherein the display panel further comprises a plurality of light emitting control lines electrically connected to the pixels, respectively, and
the light emitting stages are electrically connected to the light emitting control lines, respectively, and receive the clock signals and the carry signal.

12. The electronic device of claim 11, wherein
the scan stages comprise first scan stages, second scan stages and third scan stages,
areas in which the first scan stages, the second stages, and the light emitting stages are respectively disposed have a same size as each other, and
areas in which the third scan stages are respectively disposed have a size smaller than areas in which the first scan stages are respectively disposed.

13. The electronic device of claim 1, wherein the masking signal has a width greater than a width of the scan signal.

14. The electronic device of claim 13, wherein the scan signal comprises:
a first portion having a first level; and
a second portion subsequent to the first portion and having a second level lower than the first level.

15. The electronic device of claim 13, wherein the masking signal overlaps an entire portion of the scan signal output from one of the scan stages respectively connected to the masking circuits.

16. The electronic device of claim 1, wherein a first scan signal output from an n-th scan stage among the scan stages respectively connected to the masking circuits does not overlap a second scan signal output from an (n-1)-th scan stage among the scan stages,
wherein n is an integer greater than 1.

17. The electronic device of claim 16, wherein the second scan signal does not overlap the masking signal.

18. The electronic device of claim 16, wherein the first scan signal overlaps the masking signal.

19. The electronic device of claim 16, wherein the masking signal has a width greater than a width of each of the first and second scan signals.

20. A method of driving an electronic device comprising a display panel and a plurality of scan stages, the method comprising:
allowing an i-th scan stage among the scan stages to receive clock signals and a carry signal and to output a first scan signal, wherein i is an integer greater than 0;
allowing a masking circuit connected to the i-th scan stage to receive a masking signal and to output a masking carry signal in response to the masking signal; and
allowing an (i+1)-th scan stage among the scan stages to receive the masking carry signal as the carry signal thereof and to output a second scan signal,
wherein the masking signal has a first width greater than a second width of the first scan signal, and
the masking signal overlaps an entire portion of the first scan signal.

21. The method of claim 20, wherein
the masking signal comprises a first masking signal and a second masking signal, and
the outputting the masking carry signal comprises:
outputting the first scan signal as the masking carry signal when the first masking signal has a first level and the second masking signal has a second level different from the first level; and
allowing the first scan signal not to be output as the masking carry signal when the first masking signal has the second level and the second masking signal has the first level.

22. The method of claim 20, further comprising:
driving the display panel, wherein the display panel comprises a first display area and a second display area adjacent to the first display area, and
the driving the display panel comprises:
driving the display panel in a multi-frequency mode or a normal mode;
driving the first display area at a first driving frequency in the multi-frequency mode; and
driving the second display area at a second driving frequency different from the first driving frequency in the multi-frequency mode.

23. The method of claim 22, wherein the first driving frequency is higher than the second driving frequency.

24. The method of claim 22, wherein the driving the display panel in the multi-frequency mode or the normal mode comprises:
substantially simultaneously displaying a still image and a video through the first display area in the multi-frequency mode; and
changing the multi-frequency mode of the first display area to the normal mode when a time duration of the still image reaches a predetermined time.

25. The method of claim 20, wherein the carry signal comprises:
a first portion having a first level; and
a second portion subsequent to the first portion and having a second level lower than the first level.

26. The method of claim 20, wherein
the masking circuit is provided in plural, and
a third scan signal output from an n-th scan stage among the scan stages respectively connected to the masking circuits does not overlap a fourth scan signal output from an (n-1)-th scan stage among the scan stages,
wherein n is an integer greater than 1.

27. The method of claim 26, wherein the fourth scan signal does not overlap the masking signal.

28. The method of claim 26, wherein the third scan signal overlaps the masking signal.

29. The method of claim 26, wherein the masking signal has a width greater than a width of each of the third scan signal and the fourth scan signal.

\* \* \* \* \*